US007925253B2

(12) United States Patent
Breit et al.

(10) Patent No.: US 7,925,253 B2
(45) Date of Patent: *Apr. 12, 2011

(54) RADIATED PERFORMANCE OF A WIRELESS DEVICE

(75) Inventors: Gregory Alan Breit, San Diego, CA (US); Dennis Michael Feenaghty, Solana Beach, CA (US)

(73) Assignee: QUALCOMM Incorporated, San Diego, CA (US)

( * ) Notice: Subject to any disclaimer, the term of this patent is extended or adjusted under 35 U.S.C. 154(b) by 815 days.

This patent is subject to a terminal disclaimer.

(21) Appl. No.: 11/852,228

(22) Filed: Sep. 7, 2007

(65) Prior Publication Data

US 2008/0129615 A1 Jun. 5, 2008

Related U.S. Application Data

(60) Provisional application No. 60/843,035, filed on Sep. 8, 2006.

(51) Int. Cl.
*H04W 24/00* (2009.01)
(52) U.S. Cl. ..... 455/425; 455/423; 455/424; 455/226.1; 455/418
(58) Field of Classification Search ............... 455/226.1, 455/423–425, 418–420
See application file for complete search history.

(56) References Cited

U.S. PATENT DOCUMENTS

| | | | |
|---|---|---|---|
| 6,233,437 B1 * | 5/2001 | Klenner | 455/115.2 |
| 6,525,657 B1 * | 2/2003 | Wojcik | 340/514 |
| 6,587,671 B1 * | 7/2003 | Kanago et al. | 455/67.11 |
| 7,035,594 B2 | 4/2006 | Wallace et al. | |
| 7,234,588 B1 * | 6/2007 | Buxton | 198/839 |
| 7,773,964 B2 * | 8/2010 | Ozaki et al. | 455/226.1 |
| 2001/0018333 A1 * | 8/2001 | Klenner | 455/115 |

FOREIGN PATENT DOCUMENTS

| | | | |
|---|---|---|---|
| EP | 0720407 | | 7/1996 |
| WO | 02056041 | | 7/2002 |
| WO | 2006047677 | | 5/2006 |
| WO | WO2006/047677 | * | 5/2006 |

OTHER PUBLICATIONS

International Search Report—PCT/US2007/078079, International Search Authority—European Patent Office—Feb. 21, 2008.
Written Opinion—PCT/US2007/078079, International Search Authority—European Patent Office—Feb. 21, 2008.

* cited by examiner

*Primary Examiner* — Lester Kincaid
*Assistant Examiner* — Mehmood B Khan
(74) *Attorney, Agent, or Firm* — Jonathan T. Velasco; Stanton Braden

(57) ABSTRACT

Systems, methods, apparatus, processors and computer-readable media include a radiated testing module that executes a predetermined radiated performance test on a wireless device. The test dictates various performance-related parameters to measure and log at each of a plurality of predetermined positions. Further, the wireless device receives synchronization information operable to enable synchronization between the logged measurements and each of the positions. The synchronized log allows the wireless device, or another apparatus, to determine a radiated performance characteristic based on a predetermined analysis protocol. Further, the described embodiments allow for the determination of several radiated performance characteristics in a single test, using a single, unaltered wireless device.

19 Claims, 8 Drawing Sheets

| F=1960MHz | | | | | | |
|---|---|---|---|---|---|---|
| Environment | mθ | mφ | σθ | σφ | XPR,dB | Calculated ρp |
| Indoor (outdoor BTS) | 0.6 | 1.8 | 8.1 | 14.6 | 10.7 | 0.173 |
| Urban microcell | 2.4 | 2.6 | 6.2 | 8.5 | 11.4 | 0.210 |
| Urban macrocell | 11.2 | 17.1 | 11.9 | 18.5 | 7.3 | 0.268 |
| Highway macrocell | 6.6 | 10.9 | 10.4 | 14.5 | 6.6 | 0.219 |
| | | | | | Average= | 0.218 |

RADIATED PERFORMANCE OF A WIRELESS DEVICE

CLAIM OF PRIORITY UNDER 35 U.S.C. §119

The present Application for Patent claims priority to Provisional Application No. 60/843,035 entitled "RADIATED PERFORMANCE OF A WIRELESS DEVICE" filed Sep. 8, 2006, and assigned to the assignee hereof and hereby expressly incorporated by reference herein.

REFERENCE TO CO-PENDING APPLICATIONS FOR PATENT

The present Application for Patent is related to the following co-pending U.S. patent application entitled "SYSTEMS, METHODS AND APPARATUS FOR DETERMINING A RADIATED PERFORMANCE OF A WIRELESS DEVICE", U.S. Ser. No. 11/258,334 filed on Oct. 24, 2005, and expressly incorporated by reference herein.

BACKGROUND

The described embodiments relate to wireless communications devices, and more particularly, to systems, methods, apparatus, processors and computer readable media for determining the radiated performance of an antenna system associated with a wireless device.

Wireless devices utilize radio waves to provide long distance communications without the physical constraints of a wire-based system. The wireless device transmits and receives information using via the radio waves, which may be carried over predetermined frequency bands. An antenna connected to a transmitter and a receiver, along with the associated circuitry, allows the wireless device to transmit and receive these radio wave signals. The design of the wireless device, including the antenna and the various transmit- and receiver-related components, impact the ability of the wireless device to transmit and receive radio wave signals, and hence define and affect the radiated performance of the device. Thus, it is desirable to determine and tune the radiated performance of a wireless device to optimize the ability of the wireless device to communicate radio wave signals.

Prior art methods of determining the radiated performance of a wireless device, however, have a number of drawbacks. Some tests to determine radiated performance involve destructive modification of the wireless device. For instance, in one example, the signal path between the antenna and receiver is interrupted and re-routed to an external radio frequency ("RF") connector. Radiated signal power measurements are then made by external test equipment interfaced at this connector, thereby acting as a substitute for the receiver on the wireless device. The presence of the external RF connector and the associated external cable can distort the true radiated performance of the wireless device. Further, these destructive modifications add expense to the testing procedure due to both the additional equipment and the additional manpower required to make the modification. Additionally, destructive modifications add further expense by making the modified wireless device un-usable for other tests.

Additionally, in a wireless communication system, an RF modulated signal from a transmitter may reach a receiver via a number of propagation paths. The characteristics of the propagation paths typically vary over time due to a number of factors such as fading and multipath.

Further, structures such as buildings, and surrounding terrain, including walls and hillsides, contribute to the scattering and reflection of the transmitted signal. The scattering and reflection of the transmit signal results in multiple signal paths from the transmitter to the receiver. The contributors to the multiple signal paths change as the receiver moves.

Other signal sources also contribute to the degradation of the desired signal. The other signal sources may be other transmitters intentionally operating on the same frequency as the desired signal, as well as transmitters that generate spurious signals in the frequency band of the desired signal. Yet another source of signal degradation may be generated within the receiver itself. Signal amplifiers and signal processing stages within the receiver may degrade the level of the desired signal with respect to the level of thermal noise. The signal amplifiers and processors within the receiver may also generate noise products or distort the received signal and further degrade its quality.

To provide diversity against deleterious path effects and improve performance, multiple transmit and receive antennas may be used. If the propagation paths between the transmit and receive antennas are linearly independent (i.e., a transmission on one path is not formed as a linear combination of the transmissions on other paths), which is generally true to at least an extent, then the likelihood of correctly receiving a data transmission increases as the number of antennas increases. Thus, generally, diversity increases and performance improves as the number of transmit and receive antennas increases.

Further, a wireless device may use multiple antennas for a number of reasons. For example, a wireless device often needs to operate over multiple bands and service multiple operating modes. Another reason is that advanced transceiver architectures are being implemented that use multiple antennas for improving the performance of some of these modes in the field. When operated simultaneously, these modes can interfere with each other, degrading overall performance. So it is important to devise accurate means of evaluating the radiated performance of a wireless device that can capture the effects of self-interference. Current methods require several steps to evaluate a combined device/antenna design, and there is ambiguity with respect to test accuracy with current "cabled" tests. Therefore, dependable design and test methodologies have yet to be developed.

Thus, new and improved systems, apparatus, computer-readable media, processors and methods for determining the radiated performance of a wireless device are desired.

SUMMARY

The described embodiments allow for the determination, in a single test and using a single, unaltered wireless device, one or more radiated performance characteristics, such as Effective Isotropic Radiated Power ("EIRP"), receiver sensitivity, Total Radiated Power ("TRP"), Total Isotropic Sensitivity ("TIS"), and envelope correlation, which is related to receiver diversity performance.

In a further embodiment, a method of determining a radiated performance characteristic of a wireless device includes determining a measured signal characteristic of a forward link only signal received by the wireless device at each one of a plurality of associated time instances, wherein the plurality of associated time instances is relative to a starting time instance; and recording the measured signal characteristics in a log on the wireless device at each associated time instance in the plurality of associated time instances. In a related embodiment, at least one processor is configured to performed the above-described actions. In another related embodiment, a computer program resident in a computer readable medium that, when executed, directs a computer device to perform the actions noted above.

In another embodiment, an apparatus for determining a radiated performance characteristic of a wireless device includes a means for determining a measured signal characteristic of a forward link only signal received by the wireless device at each one of a plurality of associated time instances, wherein the plurality of associated time instances is relative to a starting time instance; and recording the measured signal characteristics in a log on the wireless device at each associated time instance in the plurality of associated time instances.

In still another embodiment, a controller for determining a radiated performance characteristic of a wireless device comprises a radio signal system operable to determine a measured signal characteristic of a forward link only signal received by the wireless device at each one of a plurality of associated time instances, wherein the plurality of associated time instances is relative to a starting time instance; and record the measured signal characteristics in a log on the wireless device at each associated time instance in the plurality of associated time instances.

DETAILED DESCRIPTION

Figure 1:
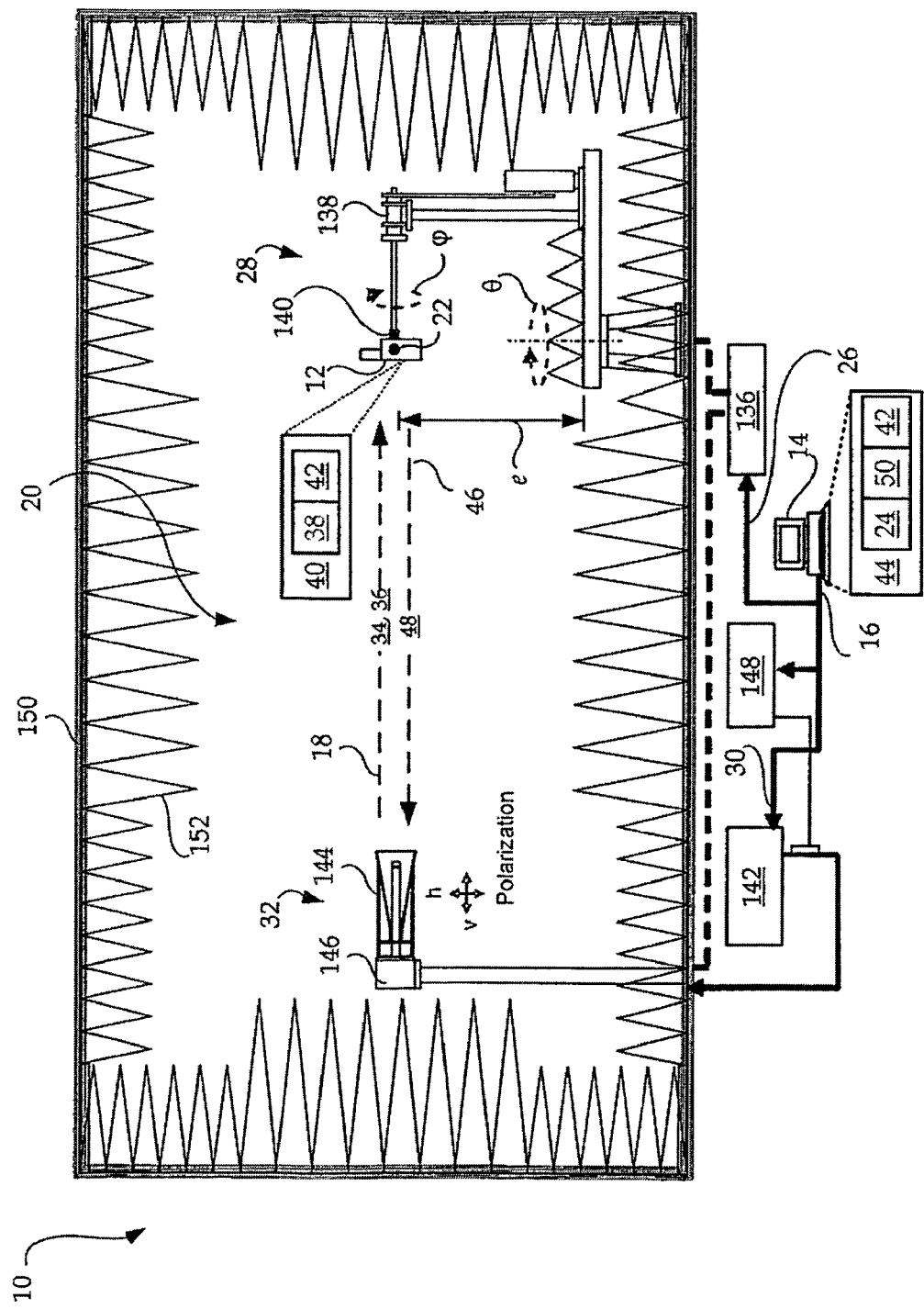
FIG. 1 is a schematic diagram of one embodiment of a system for determining a radiated performance of a wireless device.

Referring to FIG. 1, in one embodiment, a system 10 for determining a radiated performance of a wireless device 12 includes a controller system 14 operable to generate a control signal 16 to transmit a radio wave signal 18 to wireless device 12. Wireless device 12 is located within a test chamber 20 at a position 22 in a plurality of possible positions associated with a predetermined radiated performance test 24 being run by controller system 14. Control signal 16 includes a positioning component 26 that defines the physical coordinates of selected position 22 and thereby dictates the movements of a positioning system 28 to which wireless device 12 is mounted. Further, control signal 16 includes a corresponding signaling component 30, which defines a radio wave signal 18 and thereby dictates a transmission by radio signal system 32. In one embodiment, for example, radio signal system 32 simulates a base station in a cellular phone network, and thus radio wave signal 18 may be considered a forward channel signal. In one embodiment, the base station simulates a base station that operates in a forward link only mode, which means that there is only a forward link and no reverse link exists (i.e., the wireless device 12 is not configured or operable to transmit any signals back to the base station). Further, radio wave signal 18 may include an actual or reference signal characteristic 34, such as a signal power, and predetermined synchronization data 36, such as information that may be used to synchronize the measurements obtained at selected position 22 to a particular position and/or time, as further described herein. For example, reference signal characteristic 34 is a known characteristic or value that may be used as a baseline value for later calculations, such as a gain calculation. Similarly, predetermined synchronization data 36 allows measurements made by wireless device 12 to be correlated to the physical coordinates of position 22 of wireless device 12 at the time when the measurement was obtained.

In one embodiment, for the determination of TIS as the radiated performance characteristic 42 of wireless device 12, a first step is determining the receiver gain pattern of wireless device 12. One possible approach may involve obtaining received signal strength indication ("RSSI") measurements for particular angular positions of wireless device 12. For each RSSI measurement, the log record for wireless device 12 includes the time stamp of wireless device 12 and the RSSI measurement. When the positioning system 28 rotates the axes, controller system 14 records the elevation position of wireless device 12 versus the time on controller system 14 in a position versus time log. However, because the time clock of wireless device 12 is not synchronized with the time clock of controller system 14 (e.g., due to clock differences), the RSSI versus time log of wireless device 12 is not synchronized to the position versus time log of controller system 14. In one embodiment, to address this synchronization issue, predetermined synchronization data 36 comprises a power pulse that is generated and sent to wireless device 12 before the rotation of wireless device 12 begins. For example, a power pulse having a predetermined magnitude is generated by controller system 14, where controller system 14 may obtain the local machine time (in ms) as a reference time start point for the log file on controller system 14 on the falling edge of the power pulse. This reference time start point will be used later to determine a starting point in a position versus time log. In one embodiment, the time in the log may be determined the difference between the time on controller system 14 and the start point. The data post-processing will accomplish the same result on the logs from wireless device 12 by searching the falling edge of the pulse in the logs, and using the time stamp at that point as the time start point. In one embodiment, the power pulse will act as a starting point when logging starts and this power pulse will be in the log packet.

Wireless device 12 receives and processes signal 18, resulting in generating a measured signal characteristic 38 corresponding to reference signal characteristic 34. In other words, measured signal characteristic 38 is the received value, as measured by receiver-related components resident on wireless device 12, of reference signal characteristic 34. Further, wireless device 12 receives synchronization data 36 from signal 18, thereby providing the system 10 with the ability to ultimately relate the respective measured signal characteristic 38 to the respective selected position 22 at which the measurement occurred. Additionally, wireless device 12 includes a radiated performance test module 40 that monitors the measurement of the received signal and directs the parsing of its data. Further, radiated performance test module 40 executes to log measured signal characteristic 38 and synchronization data 36, thereby forming a record of the test conditions and test results for each selected position 22. System 10 then sequences through the remaining plurality of predetermined positions until the signals are received at all positions as determined by the given predetermined radiated performance test 24.

Once all testing information has been logged, radiated performance characteristic 42 may be determined at controller system 14. In this case, the log of measured signal characteristics 38, which includes synchronization data 36, may be transferred from wireless device 12 to a test manager module 44 located at controller system 14. Test manager module 44 maintains another log of position information and corresponding time information, which it correlates with the log from wireless device 12 to produce a record or log of position information synchronized with measured signal characteristics 38 for each position dictated by predetermined radiated performance test 24. In this case, test manager module 44 initiates the analysis of this synchronized log to determine radiated performance characteristic 42.

In one embodiment, the log of measure signal characteristics 38 may be transferred to controller system 14 via the use of a cable that is attached to wireless device 12 after the log is generated. In another embodiment, wireless device 12 may include a transmitter that may be used to transmit the log back to controller system 14. In the system where wireless device 12 is a forward link only device (i.e., the wireless device 12 does not contain a transmitter that can transmit a signal back to radio signal system 32 in a reverse link, wireless device 12 may include a transceiver configured for a communication system that is different from the communication system being measured. For example, wireless device 12 may include a Bluetooth® transceiver that may be used to transmit the log. Other types of transceivers may be used. Using this alternate transceiver, data may be sent to and received from wireless device 12 in real time. For example, signal characteristics 38 may be transmitted from wireless device 12 to controller system 14 as they are being measured. The use of the transceiver should not interfere with the measurement of the signal characteristics 38. In addition, control data may be transmitted between wireless device 12 and controller system 14. For example, wireless device 12 can be instructed to begin logging by controller system 14 via a command sent using the alternate transceiver.

In another embodiment, radiated performance testing module 40 may be used to analyze all of the logged measured signal characteristics 38 and uses synchronization data 36 to determine a starting point in order to generate a radiated performance characteristic 42 for wireless device 12. In one embodiment, for example, radiated performance characteristic 42 may include a radiated sensitivity metric, which is a function of the power gain and/or the voltage gain at an antenna of wireless device 12, and which may be measured for a single or for multiple antennas. For an embodiment of wireless device 12 having multiple antennas, radiated performance characteristic 38 may include complex voltage receive gains, which are utilized to predict the correlation between the multiple receive chains/antennas, thereby providing an indication of the diversity gain provided by the given antenna set-up.

In another embodiment, for example, where synchronization data 36 includes time information, radiated performance characteristic 42 may be determined at controller system 14. In this case, the log of measured signal characteristics 38 and corresponding synchronization data 36 may be transferred from wireless device 12 to a test manager module 44 located at controller system 14. Test manager module 44 maintains another log of corresponding time information and position information, which it correlates with the log from wireless device 12 to produce a record or log of position information synchronized with measured signal characteristics 38 for each position dictated by predetermined radiated performance test 24. In this case, test manager module 44 initiates the analysis of this synchronized log to determine radiated performance characteristic 42.

In other embodiments, for example, predetermined radiated performance test 24 may include a test that involves a wireless device-originated radio wave signal 46 transmitted to radio signal system 32. This test is a performance test of the transmit chain/antenna of wireless device 12. In an embodiment where radio signal system 32 simulates a base station of a cellular telephone network, wireless device-originated radio wave signal 46 may be considered a reverse channel signal. Signal 46 includes a reference signal characteristic 48, which may be used as a baseline for future calculation, and radio signal system 32 receives and processes signal 46, thereby generating a corresponding measured signal characteristic 50 as received by system 32. In this embodiment, test management module 44 on controller system 14 executes to log measured signal characteristic 50 and the corresponding position information found in position component 26. System 10 then sequences through the remaining plurality of predetermined positions until the signals 46 are received at all positions as determined by the given predetermined radiated performance test 24. Once all testing information has been logged, test management module 44 analyzes all of the logged measured signal characteristics 50 and corresponding position information from position components 26 (which also may be considered synchronization information 36) and generates radiated performance characteristic 42 for wireless device 12. In this case, for example, radiated performance characteristic 42 may include a measure of the transmission performance of wireless device 12, such as a transmit power gain. Further, wireless device 12 may be set-up to simultaneously receive signal 18 and transmit signal 46, thereby shortening testing times if there is an overlap in the plurality of predetermined positions associated with each test.

Thus, system 10 advantageously includes logging of receiver data directly on wireless device 12, thereby eliminating the need for external connectors and cables that may distort the true receiver-related radiated performance of the device. Further, system 10 advantageously provides for wireless synchronization of the measured signal characteristic 38 and the position information or physical coordinates corresponding to each selected position 22, thereby eliminating the need for external connectors and cables connected to external synchronization and post-processing equipment. Further, the logging and synchronization capability provided by wireless device 12 of system 10 allows for the simultaneous performance of multiple radiated performance tests. Therefore, system 10 provides an efficient set-up for determining the radiated performance of wireless device 12.

In one particular embodiment, for example, the systems, apparatus and methods described herein aide in the radiated testing of mobile phones. In this embodiment, several radiated performance characteristics 42 can be derived from measured data collected in a single test. In particular, the radiated performance characteristics 42 that can be determined are: a total radiated power ("TRP") characteristic, a total isotropic sensitivity ("TIS") characteristic, a peak effective isotropic radiated power ("EIRP") characteristic, a peak receiver sensitivity characteristic, a peak gain characteristic, an average gain characteristic, and a pattern correlation for diversity enabled phones. Generally, the described embodiments perform, over-the-air (OTA), complex receive and maximum transmit EIRP pattern measurements at three channel frequencies without requiring test cables being connected to the device under test. By performing the predetermined radiated tests wirelessly, the described embodiments improve measurement accuracy by eliminating external antenna test cables that can distort radiation patterns. Further, the described embodiments do not require special test fixtures as only one phone is needed for all tests; in contrast, the prior art requires a separate cabled phone fixture for antenna gain/pattern tests and a second, wireless phone for the peak EIRP and receive sensitivity radiated tests. Additionally, this particular embodiment provides accelerated testing methodologies, as described in more detail below, that are much faster than current TRP and TIS test methodologies. For example, based on experimental results using the present system, the total duration of the TRP and TIS tests is about 1.75 hours for low, mid, and high frequencies, compared with about a 3-5 hour duration for the prior art TIS test at only one frequency.

In this particular embodiment, for example, the measurements are performed in a calibrated far-field anechoic chamber. The testing application is loaded into the device under test (e.g., wireless device 12) while other special purpose control and post processing software is loaded into a host computer (e.g., controller system 14) controlling the chamber equipment. A cell site simulator or call box is connected to the chamber horn antenna, thereby enabling an OTA call to a test phone mounted on a rotating pedestal at the far end of the chamber.

For receive mode tests, the device under test is commanded to log user-defined data packets to memory on the device under test. The defined data packets, such as a "finger channel estimate" log packet, contain the complex pilot signals (e.g., In-phase and Quadrature-phase) received by the antennae of the device under test when the device under test is illuminated by an electromagnetic plane wave transmitted from the call box equipment. In one embodiment, the logging may be triggered by sending commands from the call box over-the-air to the device under test. By synchronizing this logging event with the movement of the pedestal and device under test, the complex in-phase and quadrature-phase receive pattern data is obtained at each measurement angle over a field of view covering a sphere. Further, tests are done with the chamber horn oriented for vertical and horizontal polarizations, and thus vertical and horizontal receive patterns are obtained. Additionally, for diversity-enabled devices, the complex receive pattern of the secondary antenna is obtained by logging the same packet data in a similar manner.

For transmit mode tests, a power meter is used to measure the radiated power transmitted by the device under test in a given measurement direction with the phone transmitter at maximum power. The device under test is commanded, such as via OTA signals from the call box equipment, to radiate at its maximum transmit power. The transmitted power is collected by the chamber horn and measured by a power meter at each measurement angle. Further, the chamber path loss is determined, and thereby can be accounted for by the reference signal, thereby allowing for the determination of the phone's EIRP. The measured data is stored in real time as the device under test is rotated to the various test angles covering a sphere. Further, tests are done for the chamber horn oriented in both vertical and horizontal polarizations, and thus the vertical and horizontal polarization EIRP patterns are obtained.

All measurements—the transmit EIRP and the primary and secondary antenna receive complex field measurements—may be performed in sequence at each measurement angle. Hence, all receive and transmit data can be collected with a single test run.

Additional details relating to this particular embodiment are discussed below.

Figure 2:
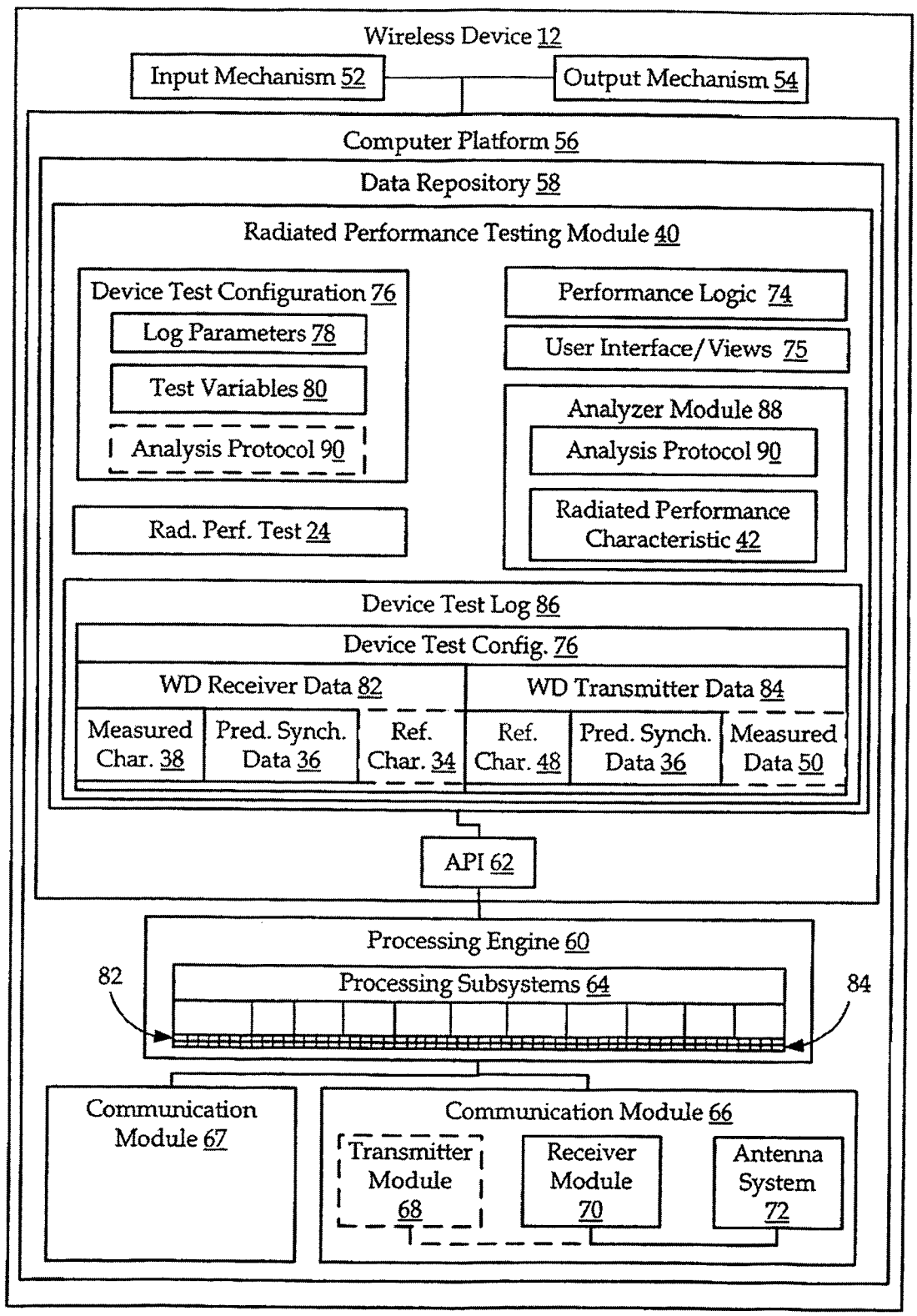
FIG. 2 is a schematic diagram of one embodiment of a wireless device used in the system of FIG. 1.

Referring to FIG. 2, wireless device 12 can include any type of computerized, wireless device, such as a cellular telephone, a personal digital assistant, a two-way text pager, and a portable computer. The wireless device can be a remote-slave, or other device that does not have an end-user thereof but simply communicates data across a wireless network. Examples of a remote-slave device include a remote sensor, a diagnostic tool, a data relay, and the like. The functionalities performed on wireless device 12 described herein can accordingly be performed on any form of wireless device or computer module, including, without limitation, wireless modems, PCMCIA cards, wireless access terminals, wireless personal computers, wireless telephones, or any combination or sub-combination thereof.

Additionally, wireless device 12 has an input mechanism 52 for generating inputs into wireless device, and output mechanism 54 for generating information for consumption by the user of the wireless device. For example, input mechanism 52 may include a mechanism such as a key or keyboard, a mouse, a touch-screen display, a voice recognition module, etc. The inputs into wireless device may include menu selections to set-up, change parameters, and run a radiated test, or to transfer logged information out of the device. Further, for example, output mechanism 54 may include a display, an audio speaker, a haptic feedback mechanism, etc. The generated information to output may include the above-referenced menus for performing a test and transferring the test results, a view of the test results, etc.

Further, wireless device 12 has computer platform 56 that can transmit data across a wireless network, and that can receive and execute software applications and display data transmitted from another computer device connected to the wireless network. Computer platform 56 includes a data repository 58, which may comprise volatile and nonvolatile memory such as read-only memory ("ROM") and/or random-access memory ("RAM"), erasable programmable read-only memory ("EPROM"), electronically erasable programmable read-only memory ("EEPROM"), flash memory cards, or any memory common to computer platforms. Further, data repository 58 may include one or more secondary or tertiary storage devices, such as magnetic media, optical media, tape, or soft or hard disk.

Further, computer platform 56 also includes a processing engine 60, which may be an application-specific integrated circuit ("ASIC"), or other chipset, processor, logic circuit, or other data processing device. Processing engine 60 or other processor such as ASIC may execute an application programming interface ("API") layer 62 that interfaces with any resident programs, such as radiated performance testing module 40, in data repository 58 of wireless device 12. API 62 is a runtime environment executing on the respective wireless device. One such runtime environment is Binary Runtime Environment for Wireless® (BREW®) software developed by Qualcomm, Inc., of San Diego, Calif. Other runtime environments may be utilized that, for example, operate to control the execution of applications on wireless computing devices.

Processing engine 60 includes various processing subsystems 64 embodied in hardware, firmware, software, and combinations thereof, that enable the functionality of wireless device 12 and the operability of the wireless device on a wireless network. For example, processing subsystems 64 allow for initiating and maintaining communications, and exchanging data, with other networked devices. In one embodiment, such as in a cellular telephone, communications processing engine 60 may include one or a combination of processing subsystems 64, such as: sound, non-volatile memory, file system, transmit, receive, searcher, layer 1, layer 2, layer 3, main control, remote procedure, handset, power management, diagnostic, digital signal processor, vocoder, messaging, call manager, Bluetooth® system, Bluetooth® LPOS, position determination, position engine, user interface, sleep, data services, security, authentication, universal subscriber identity module/subscriber identity module ("USIM/SIM"), voice services, graphics, universal serial bus ("USB"), multimedia such as moving picture experts group ("MPEG"), general packet radio service ("GPRS"), etc. For the disclosed embodiments, processing subsystems 64 of processing engine 60 may include any subsystem components that interact with applications executing on computer platform 56. For example, processing subsystems 64 may include any subsystem components which receive data reads and data writes from API 62 on behalf of radiated performance testing module 40. Further, all or portions of the receiver-related data and/or transmitter-related data that is gathered and then logged by radiated performance testing module 40 is available from these subsystems 64.

Computer platform 56 may further include a communications module 66 embodied in hardware, firmware, software, and combinations thereof, that enables communications among the various components of the wireless device 12, as well as between wireless device 12 and a wireless network. In one embodiment, for example, communications module 66 include a transmitter module 68 for wirelessly transmitting information such as radio wave signal 48 through an antenna system 72, and a receiver module 70 for wirelessly receiving information such as radio wave signal 18 through antenna system 72. As noted above, antenna system 72 may include a single antenna, such as a monopole antenna, a dipole antenna, a helical antenna, a planar antenna, etc., or any combination thereof to form multiple antennas. For example, such multiple antenna systems may include a multiple-input multiple-output ("MIMO") communication system, which employs multiple ($N_T$) transmit antennas and multiple (NR) receive antennas for data transmission. Alternately, for example, such multiple antenna systems may include a multiple-input single-output ("MISO") communication system that employs multiple ($N_T$) transmit antennas and a single receive antenna for data transmission. In any case, receiver module 70 in combination with antenna system 72 may be considered the receive chain of wireless device 12. Similarly, transmitter module 68 and antenna system 72 may be considered the transmit chain of the wireless device. Other communication modules may exist in computer platform 56 in addition to communication module 66. For example, a communication module 67 may be included to provide other communications capability for wireless device 12 using such wireless communications protocol as Bluetooth® or IEEE 802.11. The communications capabilities could be transmit only, receive only, or both transmit and receive.

Additionally, as mentioned above, computer platform 13 further includes radiated performance test module 40 to manage radiated testing-related activities on wireless device 12. Radiated performance test module 40 may include any hardware, software, firmware and/or other set of executable instructions operable to manage the collection of any information, such as receiver data and/or transmitter data, relating to a radiated performance characteristic 42 of wireless device 12. Radiated performance test module 40 may be initiated at any time to log, store and make available measured signal characteristic 38, synchronization data 36, any transmitter- and/or receiver-related data, and/or any information related to predetermined radiated performance test 24.

In one embodiment, for example, radiated performance test module 40 includes performance logic 74 that provides the capability to collect, store and provide access to, or forward, radiated performance test-related information. Further, in some embodiments, performance logic 74 may initiate the capability of wireless device 12 to generate radiated performance characteristic 42 based on the parameters of a given performance test 24.

Further, radiated performance test module 40 includes a device test configuration 76 that defines log parameters 78 and/or test variables 80 corresponding to predetermined radiated performance test 24 being run by controller system 14. For example, log parameters 78 define types of information to collect and log as receiver data 82 and/or transmitter data 84 for the given radiated performance test. In one embodiment, for example, log parameters 78 define measured or reference receiver data 82 and/or measured or reference transmitter data 84 available from one or more processing subsystems 64. In the case of a wireless telephone, for example, log parameters 78 may include log data packets available from processing engine 60 and/or processing subsystem 64. Examples of the information contained in such log data packets include, but are not limited to: received power from a given receive chain/antenna, transmitted power from a given transmit chain/antenna, in-phase pilot voltages and quadrature-phase pilot voltages associated with a given receive chain, finger lock status, relative delay in a received signal (e.g. the time difference between receiving a first and second instance of the same signal, such as when receiving a reflected signal), etc. In particular, in one embodiment of a CDMA system, such log data packets include the "Search TNG Finger Status" packet, the "RF" subpacket, the "Finger Info" subpacket, and the "Filtered Pilot Symbol" subpacket. In another embodiment of a CDMA system, an example log data packet is the "WCDMA finger info for TA—Finger/pilot channel parameters" packet or the "Diversity antenna radiation status" packet. In the case of a forward link only device, an example log data packet is the "MFLO RSSI Value Dynamic Params" packet. Additionally, or alternatively, log parameters 78 may define other radiated performance-related information received by or otherwise accessible to wireless device 12. For example, in one embodiment, log parameters 78 may include test configuration-related information, and/or information in data packets from signals received by wireless device 12, such as reference signal characteristic 34 and/or synchronization data 36 from signal 18. It should be understood, however, that many other log parameters 78 may be defined depending on the nature of the given radiated performance test.

Further, for example, test variables 80 define values associated with collecting receiver data 82 and/or transmitter data 84, and/or performing analysis on the collected data. In one embodiment, for example, types of test variables 80 include a sampling rate, a number of data packets per sample, a code to enable or disable logging, etc. It should be understood, however, that many other test variables 80 may be defined depending on the nature of the given radiated performance test.

Figure 3:
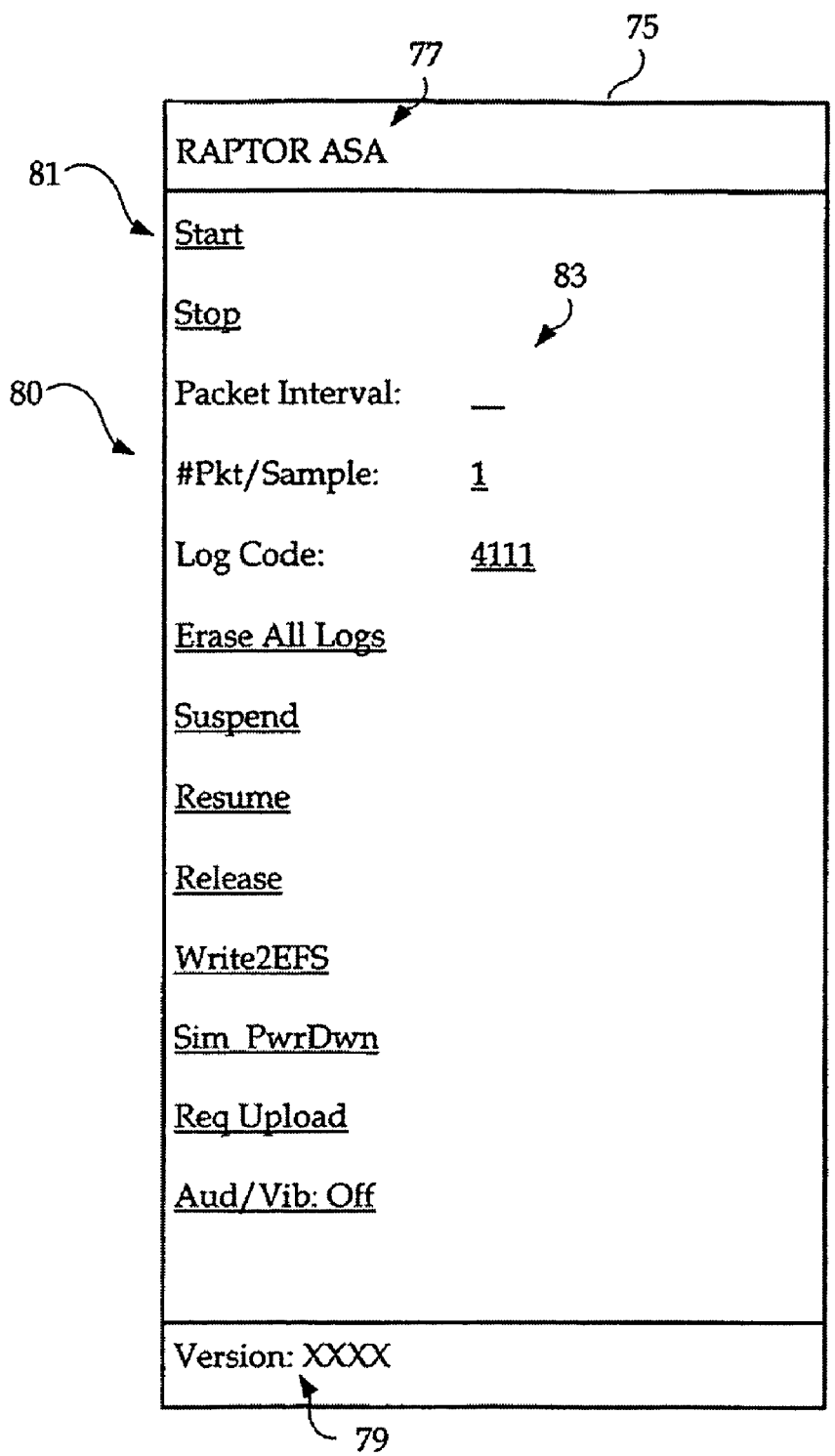
FIG. 3 is a schematic diagram of one embodiment of a user interface/view operable on the wireless device of FIG. 1.

Additionally, performance logic 74 may execute to prompt a user of wireless device 12 to select a given device test configuration 74, and/or the associated log parameters 78 and/or test variables 80, from a plurality of available test configurations, log parameters and/or test variables. For example, referring to FIGS. 2 and 3, radiated performance testing module 40 may include a user interface or views 75, such as a plurality of navigation menus that may be presented to a user via output mechanism 54. Views 75 may include header information 77 and footer information 79, such as to identify the given menu, program and/or version. Further, views 75 may present executable commands 81 to enable various functionality associated with a given test. For example, commands 81 may include commands such as: start, to instruct the module to start logging based on the configuration; stop, to instruct the module to stop logging; erase all logs, to erase any logs stored in memory; suspend, to instruct the module to suspend logging, however, the module may include logic to automatically suspend logging if the memory being used reaches a predetermined threshold; resume, to re-initiate logging following a suspend command; release, to release the internal memory buffer, for example, for use for debugging operations; write to memory, to write recorded data from a first memory to a second memory; simulated power down, to cause the device to mimic a normal power down so that clean up functions will be called and executed, which is useful for debugging; request upload, to request an upload of any stored data and/or logs to another computer device, such as controller system 14; and audio/vibration, a toggle for setting audio and/or vibrate alert feedback, for example, for use when receiving a command from another device, and/or initiating a data call, and/or when requesting or completing an upload, and for use in debugging operations. Additionally, views 75 may include changeable fields 83, such as for entering values for test variables 80. Thus, a user may configure and run a predetermined radiated performance test through views 75 on wireless device 12.

Alternatively, device test configuration 76 may be transmitted to wireless device 12 via a wired or wireless connection, or may be included on computer platform 56 at the time of manufacture.

Additionally, radiated performance test module 40 includes device test log 86 for storing the radiated performance-related information based on device test configuration 76. Device test log 86 comprises a record stored in data repository 58 that may include the test conditions and/or the test results associated with one or more radiated performance tests performed using wireless device 12. As noted above, for example, device test log 86 may include wireless device ("WD") receiver data 82 and/or WD transmitter data 84. In one embodiment, receiver data 82 includes one or more measured signal characteristics 38, which is/are collected from processing subsystem 64 upon the processing of signal 18 at each selected position 22. Additionally, device test log 86 may include other information that corresponds to the data generated by wireless device during a given radiated performance test. For instance, device test log 86 may include information contained within a received signal, such as predetermined synchronization data 36 and/or reference signal characteristic 34 from signal 18. In one embodiment, reference signal data 34 may be data that defines the original state of signal 18 received by wireless device 12, such as a power value, an amplitude value, a phase value, a frequency value, a signal type/protocol, etc. In one embodiment, predetermined synchronization data 36 may be time information corresponding to a time when wireless device was in selected position 22, or position information defining the coordinates of selected position 22. Further, device test log 86 may include all or any portion of device test configuration 76 in association with the collected receiver data 82 and/or transmitter data 84 to provide a convenient reference to the test conditions associated with a given set of collected data.

Further, in some embodiments, radiated performance test module 40 may include device analyzer module 88 to determine radiated performance characteristic 42 associated with wireless device 12 for a given predetermined radiated performance test 24. Device analyzer module 88 may include any hardware, software, firmware and/or other set of executable instructions operable to analyze any information collected in device test log 86 and generate radiated performance characteristic 42. In one embodiment, for example, device analyzer module 88 may include an analysis protocol 90, which may include functions, algorithms, etc. associated with a method of processing and/or analyzing the information in log 86 to generate radiated performance characteristic 42. For example, analysis protocol 90 may include implementations of performance tests, integration protocols, simulation models, predictive models, statistical analysis, etc., such as for utilizing the logged information to determine a desired metric, such as a partial solution to a test result, or the final solution to the test, i.e. the radiated performance characteristic 42. As such, radiated performance characteristic 42 may be a metric such as, but not limited to, a power and/or voltage gain, a sensitivity measurement, a complex pattern correlation, a fading correlation, a gain differential between two receive chains/antennas, etc. Further, radiated performance test module 40 may store the generated radiated performance characteristic 42 in device test log 86, or in some other record in association with one or more of the components of log 86, for transmission, review and/or analysis on wireless device 12 and/or at another computerized device, such as controller system 14. Additionally, analysis protocol 90 may be contained within device test configuration 76, and accessed by device analyzer module 88 during execution to determine a radiated performance test result.

Any of the functionalities of the components of wireless device 12 illustrated in FIG. 1 may be implemented with another device. In addition, certain components may be located on a separate device. For example, where the wireless device 12 is an adapter card that provides wireless communications capabilities for a computing device such as a laptop, parts of or all of the device test log 86 may be stored on the laptop. Similarly, some or all of the parts of the computing platform 56 may be located on the laptop itself.

Referring to FIGS. 1 and 4-6, controller system 14 may comprise at least one of any type of hardware, software, firmware, workstation, server, personal computer, mini computer, mainframe computer, or any special purpose or general computing device. Further, controller system 14 may reside entirely on the wireless device 12. Additionally, controller system 14 can include separate servers or computer devices that work in concert to perform the functions describe herein. Controller system 14 (or plurality of modules) can send software agents or applications, such as the resident radiated performance testing module 40, to wireless device 12 across a wireless network, such that wireless device 12 returns information from its resident applications and subsystems. For example, wireless device 12 may transmit the result of executing device test configuration 76 during a predetermined radiated performance test 24 in the form of device test log 86, where controller system 14 may then synchronize this with predetermined time information or position information to generate radiated performance characteristic 42.

Additionally, controller system 14 has an input mechanism 92 for generating inputs into the system, and an output mechanism 94 for generating information for consumption by the user of the controller system. For example, input mechanism 92 may include a mechanism such as a key or keyboard, a mouse, a touch-screen display, a voice recognition module, etc. The inputs into controller system 14 may include menu selections to set-up, change parameters, and run a radiated test, or to synchronize logged information from the wireless device with logged information on the controller system. Further, for example, output mechanism 94 may include a display, an audio speaker, a haptic feedback mechanism, etc. The generated information to output may include the above-referenced menus for performing a test and synchronizing and/or computing the test results, a view of the test results, etc.

Further, controller system 14 has computer platform 96 that can transmit and receive data, and that can receive and execute software applications and cause the display of data. Computer platform 96 includes a storage mechanism 98, which may comprise volatile and nonvolatile memory such as read-only memory ("ROM") and/or random-access memory ("RAM"), erasable programmable read-only memory ("EPROM"), electronically erasable programmable read-only memory ("EEPROM"), flash memory cards, or any memory common to computer platforms. Further, storage mechanism 98 may include one or more secondary or tertiary storage devices, such as magnetic media, optical media, tape, or soft or hard disk.

Further, computer platform 96 also includes a central processing unit 100, which may be one or a combination of an application-specific integrated circuit ("ASIC") or other chipset, a logic circuit, a programmable logic machine, or any other data processing device. Central processing unit 100 interprets and executes instructions and data contained in software, such as all or portions of radiated test manager module 44, as is discussed below in more detail.

Additionally, computer platform 96 further includes a communications module 102 embodied in hardware, firmware, software, and combinations thereof, that enables communications among the various components of controller system 14, as well as between controller system 14 and other devices, such as positioning system 28, radio signal system 32, and wireless device 12. For example, communications module 102 includes input ports and output ports, such as for receiving device test log 86 and transmitting control signal 16, respectively.

As noted previously, computer platform 96 further includes radiated test manager module 44 to execute and manage all radiated performance test activities on controller system 14. Radiated test manager module 44 may be embodied in hardware, firmware, software, and combinations thereof. In one embodiment, radiated test manager module 44 includes management logic 104 that provides the capability to run predetermined radiated performance test 24. Further, in some embodiments, management logic 104 may provide the capability to initiate the analysis of collects logs to generate radiated performance characteristic 24.

In one embodiment, radiated test manager module 44 includes a library 106 having a plurality of predetermined radiated performance tests 108 that may be run by controller system 14. For example, the plurality of predetermined radiated performance tests 108 may include different test protocols, which can vary by standards body, wireless carrier, wireless device manufacturer, wireless device processor, antenna system, model of wireless device, and also which may be designed to determine different radiated performance characteristics. In any case, management logic 104 may provide an interface to a user to select radiated performance test 24 from among the plurality of predetermined radiated performance tests 108. Alternately, radiated performance test 24 may be individually loaded onto computer platform 96 and executed by radiated test manager module 44.

Figure 5:
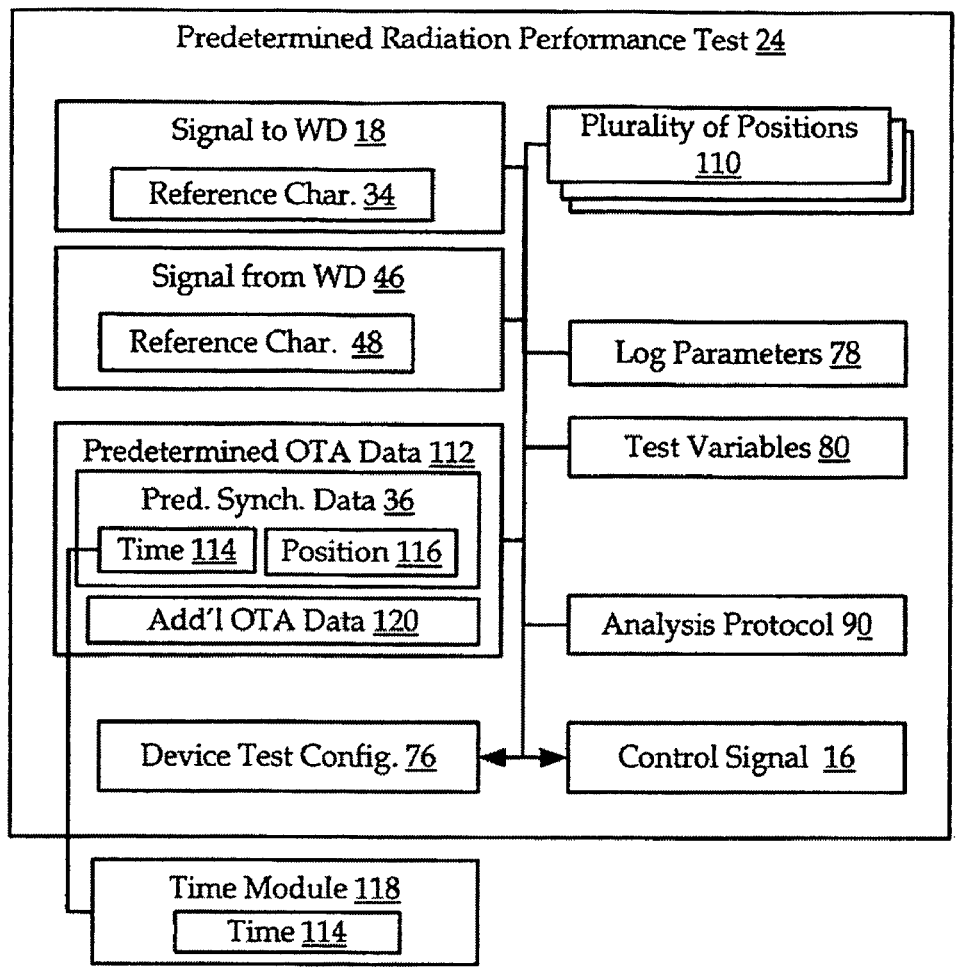
FIG. 5 schematic diagram of one embodiment of the components of a predetermined radiated performance test used by the wireless device and/or the controller system of FIG. 1.

Referring to FIG. 5, in one embodiment, predetermined radiated performance test 24 includes a set of a plurality of positions 110 at which signals 18 and 46 are respectively transmitted to or from wireless device 12. The plurality of positions 110 correspond to a particular test protocol. For example, as required by some radiated tests, the plurality of positions 110 may comprise points on a sphere. It should be understood, however, that plurality of positions 110 may comprise points that can be associated with any type of line or any type of shape. As noted previously, associated with each signal 18, 46 may be one or more reference signal characteristics 34 and 48, respectively. These reference signal characteristics 34, 48 may include, but are not limited to, a signal power, a signal amplitude, a signal phase, a signal frequency, a signal type/protocol, and any other controllable signal parameter that may be set for purposes of determining a radiated performance of wireless device 12.

Additionally, in some embodiments, each signal 18, 46 may further include data packets, which may be defined as predetermined over-the-air ("OTA") data 112. For example, as noted above, predetermined OTA data 112 may include predetermined synchronization data 36 that defines time information 114 and/or position information 116. Time information 114 includes data that defines a time when wireless device 12 is at one of the plurality of positions 110, such as selected position 22. In one embodiment, for example, time information 114 may be acquired from a time module 118, which may be a local module associated with central processing unit 100 or which may be a remote module accessible by controller system 14 for the purposes of synchronizing data. Position information 116 includes data that defines the spatial coordinates of selected position 22. As previously mentioned, predetermined synchronization data 36 is utilized to associate the measured value, such as measured signal characteristic 38 (received by wireless device 12) or measured signal characteristic 50 (received by radio signal system 32) at each selected position 22 with for all of the plurality of positions 110 in order to generate a set of measure data for analysis.

Further, predetermined OTA data 112 may include additional OTA data 120, which may include predefined data packets that comprise messages in a given wireless protocol. These messages may include a plurality of subpackets that further define additional data. For example, in a code division multiple access protocol, additional OTA data 120 may include paging messages, acknowledgement messages, registrations messages, system parameter messages, and any other overhead messages. Further, additional OTA data 120 may further include subpacket information such as service options, system identification ("SID") codes, network identification ("NID") codes, coordinates of a latitude and longitude of a base station, system configuration/parameter information, test configuration/parameter information, etc. Further, additional OTA data 120 may include codes to control functionality of wireless device 12, such as to turn logging on and off, to indicate a change of position, to indicate when to transmit a signal, and any other device control parameter. For instance, different SID code values may be used to turn on and turn off the recording of log parameters 78. Further, in one embodiment, predetermined synchronization data 36 may be embedded in an un-used portion of a standard overhead message defined by additional OTA data 120.

Additionally, predetermined radiated performance test 24 may further include device test configuration 76, as discussed above in detail. Device test configuration 76 may comprise the relevant information for a computerized device having the appropriate testing modules to execute all or a portion of predetermined radiated performance test 24. For instance, device test configuration 76 may allow one or both of wireless device 12 and controller system 14 to carry out predetermined radiated performance test 24. Further, device test configuration 76 may comprise summary information detailing parameters of the test. In one embodiment, for example, device test configuration 76 may be transmitted to wireless device 12 as part of additional OTA data 120.

Additionally, radiated performance test 24 may include a set of log parameters 78 and test variables 80 for executing the test, or for packaging within device test configuration 76. Also, based on the given parameters of the test, radiated performance test 24 may include a predetermined set of control commands 16 to carry out the test.

Further, predetermined radiated performance test 24 may additionally include analysis protocol 90 processing and/or analyzing the information in log 86 to generate radiated performance characteristic 42, as discussed above in detail. In an embodiment where wireless device 12 performs the analysis, for example, analysis protocol 90 may be transmitted to wireless device 12 as part of additional OTA data 120. Alternately, analysis protocol 90 may be utilized locally by controller system 14.

Referring back to FIG. 4, predetermined radiated performance test 24 is executed by radiated test manager module 44 to generate control signal 16 based on various parameters associated with test 24 at each position. As noted earlier, control signal 16 includes positioning component 26 to move wireless device 12 through each of the plurality of positions 110 via positioning system 28. Further, as noted earlier, control signal includes signaling component 30 to control the transmissions of signal 18 from radio signal system 32 to wireless device 12 based on reference signal characteristic 34.

In an embodiment, controller system 14 determines radiated performance characteristic 42 of wireless device 12, such as when wireless device 12 transfers device test log 86 to controller system 14, or when test 24 involves the measurement of transmission signal 46 from wireless device 12. In either case, referring to FIG. 6, radiated test manager module 44 further includes a control test log 122 to maintain a record of the test conditions and/or the test results. In one embodiment, for example, control test log 122 includes device test configuration 76 to record the test parameters, which may include all or any portion of the data associated with predetermined radiated test 24, as discussed above.

Further, control test log 122 may include the predetermined values of test parameters that can then be compared to the measured values of test parameters in order to determine a radiated performance of wireless device 12. For example, control test log 122 may include a record of control receiver data 126, which includes information on signals, such as signal 46, received by radio signal system 32 from wireless device 12. For example, control receiver data 126 may include measured signal characteristic 50, predetermined synchronization data 36, reference signal characteristic 48, and/or any other information associated with signal 46 received from wireless device 12. Similarly, control test log 122 may include a record of control transmitter data 128, which includes information on signals, such as signal 18, transmitted by radio signal system 32 to wireless device 12. For example, control transmitter data 128 may include reference signal characteristic 34, which defines information about signal 18 transmitted to wireless device 12, synchronization data 36, measured signal characteristic 38, and/or any other information associated with signal 18 transmitted to wireless device 12.

Additionally, in the above embodiments, radiated test manager module 44 may include a performance analyzer module 130 to execute analysis protocol 90, as discussed above, on the data contained in control test log 122 and/or device test log 86 in order to determine radiated performance characteristic 42. Performance analyzer module 130, which may be the same as or similar to analyzer module 88 on wireless device 12, may include any hardware, software, firmware and/or other set of executable instructions operable to analyze any information collected in control test log 122 and/or device test log 86.

Further, performance analyzer module 130 may additionally include synchronization logic 132 executable to collect control test log 122 and/or device test log 86 and combine records in order to synchronize signals, measurements, and positions in order to generate a synchronized data log 134. In particular, synchronization logic 132 matches synchronization data 36 between device test log 86 and control test log 122 in order to correspondingly match measured signal characteristics with their associated reference signal characteristics. For example, in one embodiment, the result of this matching combination of records is synchronized data log 134. In this case, performance analyzer module 130 executes analysis protocol 90 on synchronized data log 134 in order to generate radiated performance characteristic 42.

Referring back to FIG. 1, positioning system 28 may be any mechanism capable of moving wireless device 12 to selected position 22. In one embodiment, for example, positioning system 28 includes a position controller 136 that receives positioning component 26 of control signal 16, and directs a positioner assembly 138 to move an attached wireless device 12. For example, positioner assembly 138 may include a plurality of support structures, such as arms and bases, which may each be independently rotatable and/or linearly movable to enable positioner assembly 138 to move wireless device 12 into any given planar and/or spherical position, or to rotate wireless device 12 about an axis through the given position. In one embodiment, for example, positioner assembly 138 may rotate wireless device 12 at any angle θ about a vertical axis and about any angle φ about a horizontal axis. The movement through each cut (conical or great circle) is continuous and the measurements (e.g., RSSI measurements) are sampled continuously during DUT rotation. Thus, there is no "stop-and-go" of wireless device 12 at predetermined positions. Instead, positioner assembly 138 moves wireless device 12 at a constant velocity through each cut. Although the measurements for wireless device 12 are not taken at fixed positions, the RSSI values at specified measurement coordinates may be determined by interpolation of the sampled data. In one embodiment, the speed at which the positioner assembly 138 rotates wireless device 12 is dependent on the number of samples needed as well as the length of time required to acquire each sample.

Further, a height of wireless device 12 may be adjusted to any elevation e about a vertical axis. Positioner assembly 138 may include rotational and/or linear motors, such as servomotors, in order to receive commands from position controller 136 and precisely position wireless device 12. Further, positioner assembly 138 may include a mounting mechanism 140 for removably securing wireless device 12 to positioner assembly 138. For example, mounting mechanism 140 may be a corresponding hook and loop fastener system, tape, glue, a slotted case sized to hold the wireless device, etc.

In another embodiment, for example, the position controller 136 of positioning system 28 receives positioning component 26 of control signal 16, which identifies selected position 22, and directs a positioner assembly 138 to move an attached wireless device 12 to selected position 22. In this other embodiment, the positions chosen for selected position 22 are fixed positions, and the measurement are taken at fixed coordinates.

Still referring to FIG. 1, radio signal system 32 may be any mechanism capable of transmitting and/or receiving radio wave signals respectively to and/or from wireless device 12. In one embodiment, for example, radio signal system 32 includes a communication simulator module 142 for generating and receiving signals based on signaling component 30 of control command 16. For example, in an embodiment where wireless device 12 includes a cellular telephone, communication simulator module 142 may be a base station simulator that emulates the functions of a base station transceiver in a wireless network, such as a model 8960 Wireless Communications Test Set available from Agilent Technologies of Palo Alto, Calif. Communication simulator module 142 may include transmit and receive components that enable radio signal system 32 to transmit signal 18 and receive signal 48 through an antenna 144. In one embodiment, antenna 144 includes a direction horn-type antenna, which may include a positioner 146 to adjust a horizontal h and/or vertical v polarization associated with the signals. Additionally, positioner 146 may be able to adjust a vertical height of antenna 144, although this may not be necessary if the vertical height of wireless device 12 is adjustable by positioner assembly 138.

Figure 4:
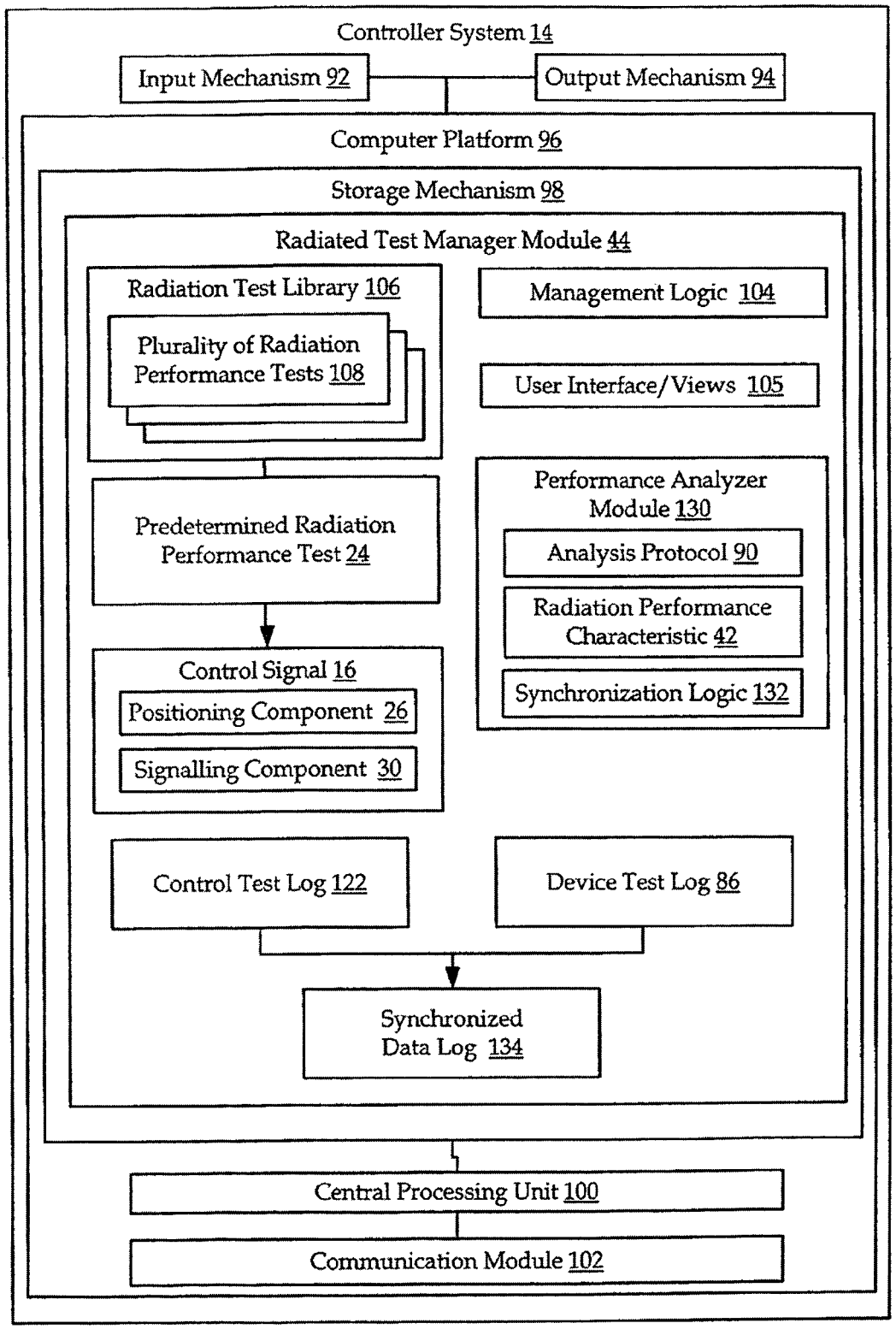
FIG. 4 is a schematic diagram of one embodiment of a controller system used in the system of FIG. 1.
Figure 6:
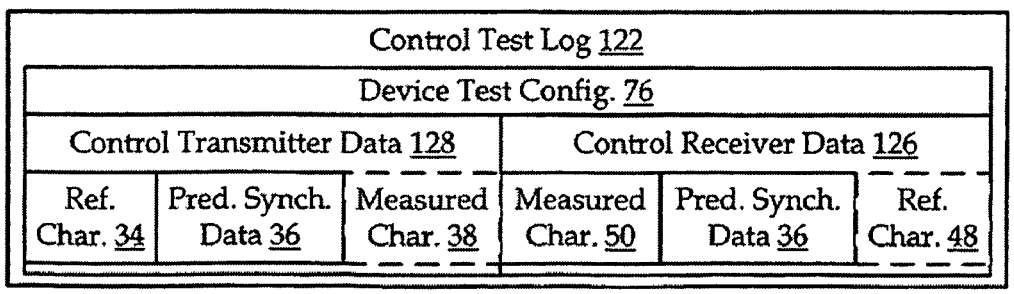
FIG. 6 is a schematic diagram of one embodiment of a control test log associated with the controller system of FIG. 4.

Additionally, as noted above, communication simulator module 142 may include receive components to measure predetermined parameters of received signal 46. Alternatively, radio signal system 32 may include additional receiver components 148, such as a power meter, to measure parameters of interest. In any case, radio signal system 32 measures the received signal 46 and reports this information to controller system 14. For example, radio signal system 32 reports control receiver data 126, such as measured signal characteristic 50, to controller system 14, which records this information in control test log 122 (FIGS. 4 and 6).

Still referring to FIG. 1, test chamber 20 provides an environment that isolates wireless device 12 from external radio waves and noise. Further, test chamber 20 provides an environment that reduces interference from reflected radio wave signals, and thus may comprise an anechoic chamber. For example, test chamber 20 includes a plurality of walls 150 that form an enclosure surrounding wireless device 12. The internally-facing sides of walls 150 include wave absorbing materials 152, such as a foam material having a plurality of cone-shaped projections for absorbing and dissipating radio waves and noise. Further, any component within test chamber 20, such as positioning assembly 138, may further include wave absorbing material 152 on one or more surfaces to reduce radio wave reflection. Thus, test chamber 20 provides radio frequency ("RF") isolation from the external environment and allows for the execution of radiated tests on the same frequency channels used by local wireless carriers without interference, such as interference to or from the commercial wireless networks.

Figure 7:
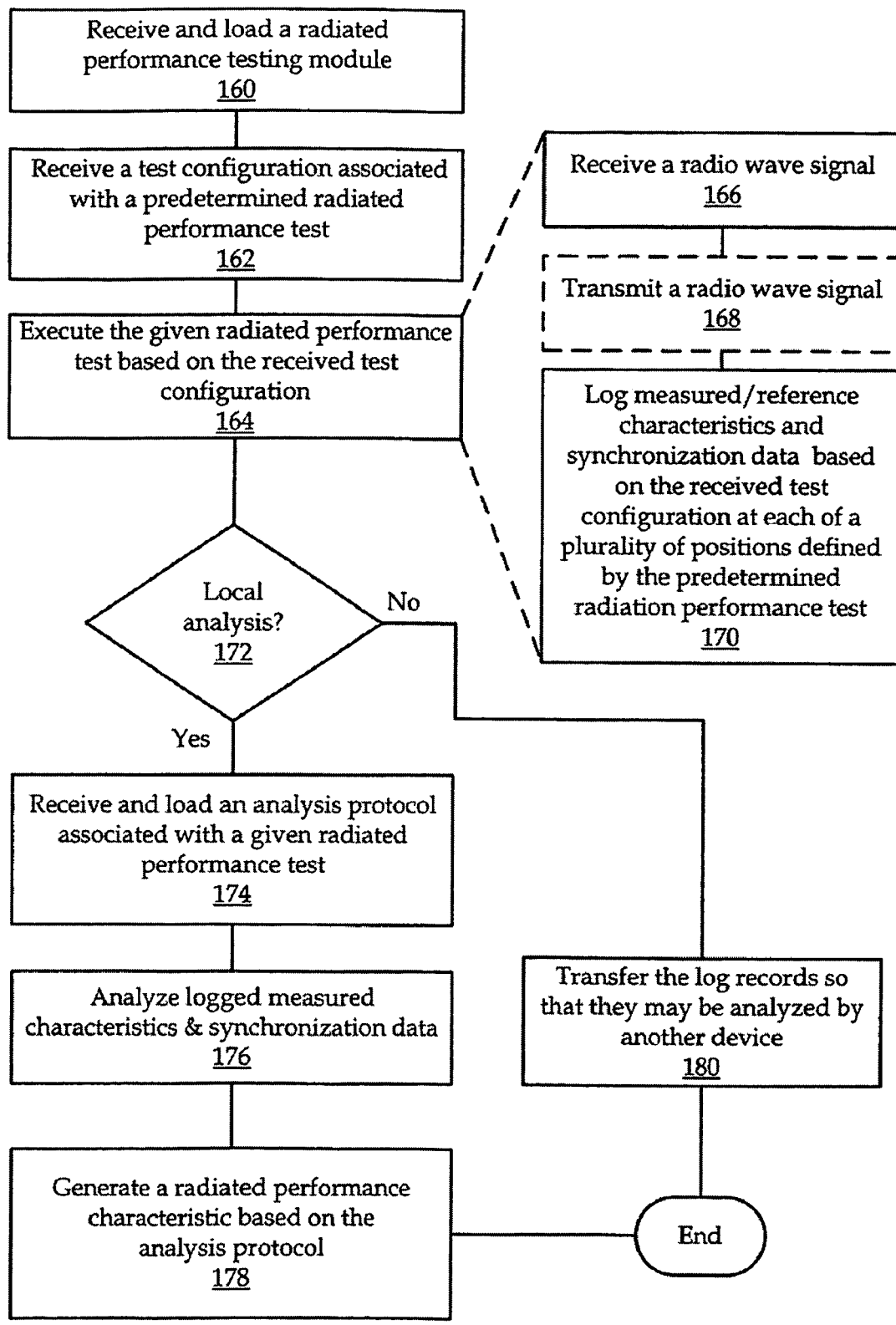
FIG. 7 is a flowchart of one embodiment of a method operable on a wireless device for determining a radiated performance of the wireless device of FIG. 1.

Referring to FIG. 7, in one embodiment, a method operable on a wireless device for determining a radiated performance characteristic of the wireless device comprises receiving and loading a radiated performance testing module (Block 160). For example, wireless device 12 may receive and load radiated performance testing module 40 via a wired or wireless connection.

Further, the method may further include receiving a test configuration associated with the predetermined radiated performance test (Block 162). For example, wireless device 12 may receive device test configuration 76 which identifies parameters 78 to log and variables 80 to utilize during the performance of the given radiated performance test.

Additionally, the method may further include executing the given radiated performance test based on the received test configuration (Block 164). Execution of the given radiated performance test may involve a number of actions, such as receiving a radio wave signal (Block 166), transmitting a radio wave signal (Block 168), and/or logging measured and/or reference signal characteristics and synchronization data based on the received test configuration at each of a plurality of positions defined by the predetermined radiated performance test (Block 170). For example, when testing the receive capabilities of wireless device 12, radiated performance testing module 40 records receiver data 82, such as measured signal characteristic 38, based on the device test configuration 76. Similarly, radiated performance testing module 40 may transmit signal 46 and log its associated reference signal characteristic 48 based on the parameters of the given radiated performance test 24. For a forward link only device, block 168 is optional as there is no possibility to test for transmission capabilities of wireless device 12 as wireless device 12 does not include a transmitter.

In an embodiment that provides for remote analysis (Block 172), the method includes transferring the log records so that they may be analyzed by another device (Block 180). For example, radiated performance testing module 40 may transfer device test log 86 to controller system 14 for further analysis. As discussed herein, the logs on wireless device 12 and controller system 14 may be synchronized by determining the point of the logs where the synchronization pulse was sent by controller system 14 appears on both logs.

In an embodiment that involves local analysis (Block 172), the method further includes receiving and loading an analysis protocol associated with a given radiated performance test (Block 174), which includes the receiver sensitivity. For example, radiated performance testing module 40 may receive an analysis protocol 90 to apply to the recorded log information in device test log 86. Further, this embodiment includes analyzing the logged measured and/or reference signal characteristics and synchronization data (Block 176), and generating a radiated performance characteristic based on the analysis protocol (Block 178). For example, radiated performance testing module 40 executes analysis protocol 90 to analyze predetermined parameters recorded within device test log 86. This analysis results in a generation of radiated performance characteristic 42.

Figure 8:
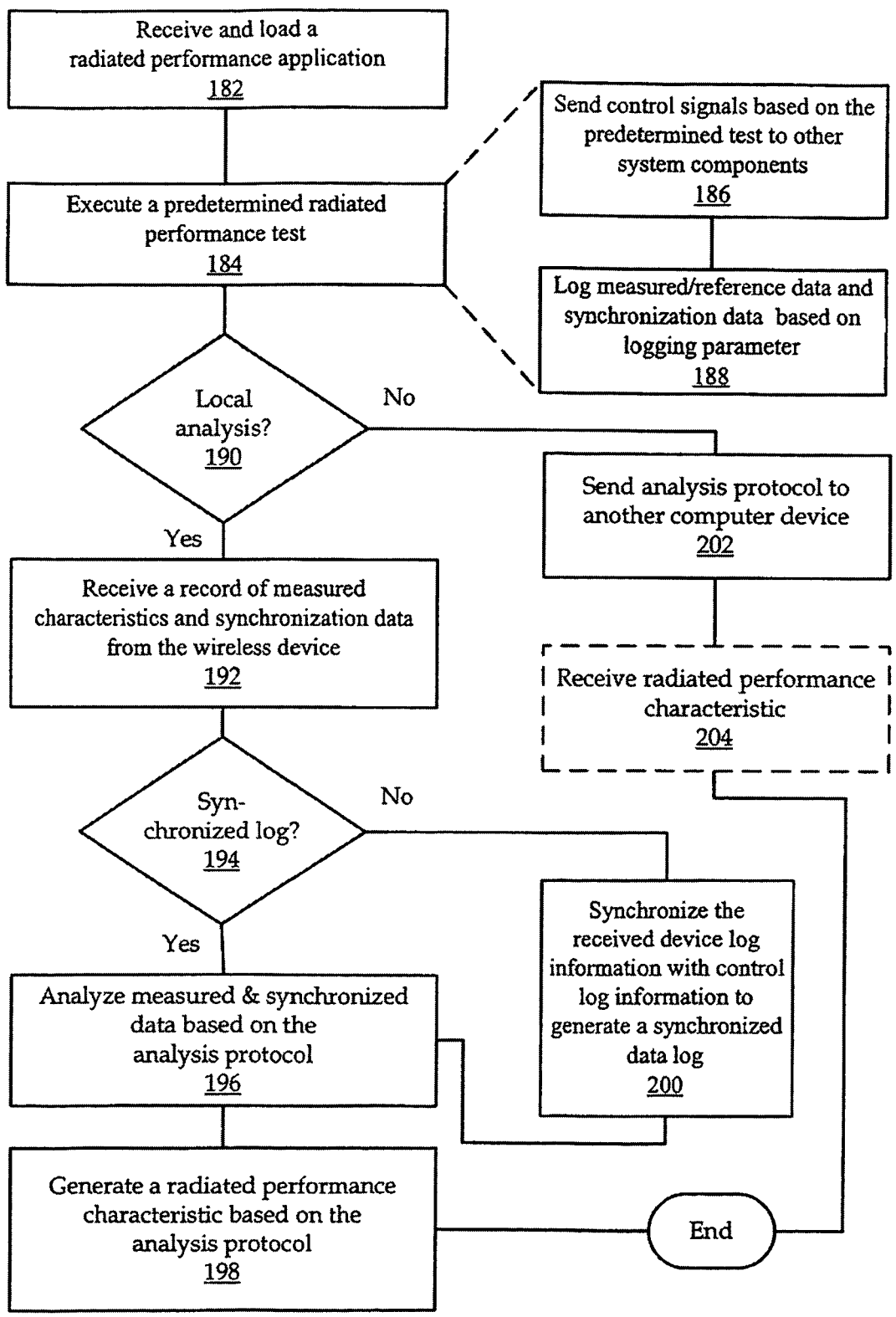
FIG. 8 is a flowchart of one embodiment of a method operable on an apparatus, such a the controller system, for determining a radiated performance of the wireless device of FIG. 1.
Figures 9, 10:
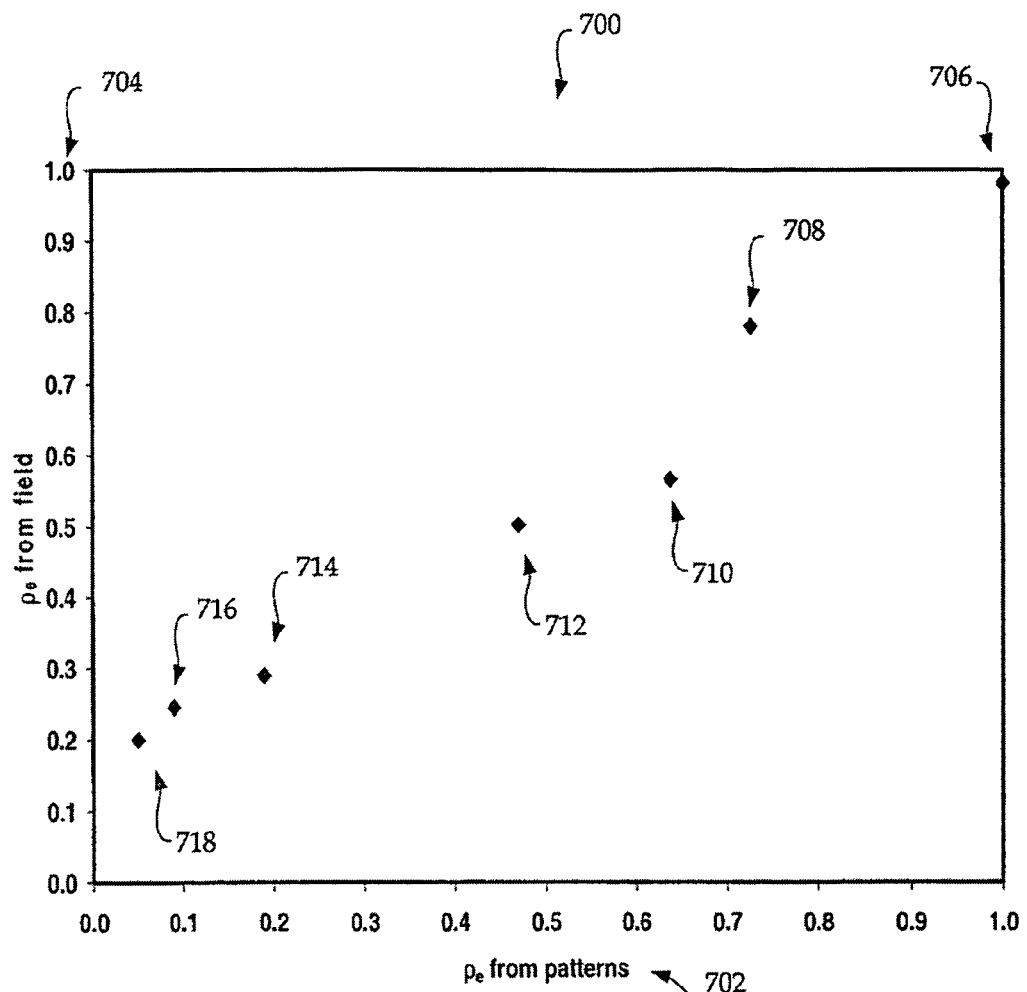
FIG. 9 is a graph of antenna rho values measured from complex radiated patterns, according to the described embodiments, compared with antenna rho values measured in the field for a number of different types of phones.
FIG. 10 is a table including calculated rho values, according to the described embodiments, for a number of different environments or channel models that represent incoming electromagnetic fields having different behaviors.

Referring to FIGS. 8, in another embodiment, a method operable on an apparatus for determining a radiated performance characteristic of a wireless device includes receiving and loading a radiated performance application (Block 182). For example, controller system 14 may receive and the load radiated test manager module 44 having one or more radiated performance tests.

Further, the method includes executing a predetermined radiated performance test (Block 184). For example, radiated test manager module 44 may execute predetermined radiated performance test 24. The execution of a predetermined radiated performance test may involve a number of actions, such as sending control signals based on the predetermined test to other system components (Block 186). For example, at each of a plurality of positions 110 associated with a given performance test 24, radiated test manager module 44 may generate control signal 16 having positioning component 26 to change the position of wireless device 12 through movements of positioning system 28. In embodiments involving the transmission of signals to wireless device 12, the action of sending control signals may further include sending a signaling component 30 to radio signal system 32 to initiate generation of signal 18. Additionally, for example, the action of executing a predetermined radiated performance test may further involve logging predetermined reference and/or measured signal characteristics and synchronization data (Block 188). For example, radiated test manager module 44 may record control receiver data 126 and/or control transmitter data 128 in control test log 122.

In an embodiment that involves local analysis (Block 190), the method further includes receiving a record of measured characteristics and synchronization data from the wireless device (Block 192). For example, radiated test manager module 44 receives device test log 86 from wireless device 12. If that the received log includes measured signal characteristics that are synchronized with position information (Block 194), then the method further includes analyzing the received log based on a predetermined analysis protocol (Block 196) and generating a radiated performance characteristic (Block 198). For example, performance analyzer module 130 may analyze device test log 86 using analysis protocol 90 to determine radiated performance characteristic 42. In one embodiment, wireless device 12 is able to determine the PER on the device itself and collects that data. The PER data is stored to device test log 86. An example FLO packet is the "MFLO MLC PLP STATS POST PARAMS" log packet that records the number of good physical layer packets (PLPs) and the number of PLP erasures. Alternatively, if the received log is not synchronized (Block 194), then the method includes synchronizing the received log information with local log information to generate a synchronized data log (Block 200). For example, performance analyzer module 130 may execute synchronization logic 132 to combine device test log 86 with control test log 122 by matching the synchronization information contained within each log, such as a power pulse sent to synchronize the starting point of the test and which appears on both logs. In this case, once synchronize data log 134 is generated, then the method may continue with the analysis of the synchronized information via a predetermined analysis protocol (Block 196) and the generation of radiated performance characteristic 42 (Block 198).

Alternatively, in an embodiment that involves remote analysis (Block 190), such as analysis on wireless device 12, the method may include transmitting an analysis protocol associated with the predetermined radiated test to another device (Block 202). For example, if not already included as part of device test configuration 76, radiated test manager module 44 may transmit analysis protocol 90 to wireless device 12, such as through signal 18. Optionally, this embodiment of the method may further include receiving the radiated performance characteristic from another device (Block 204). For example, radiated test manager module 44 may receive radiated performance characteristic 42 from wireless device 12 if the wireless device includes analyzer module 88. The information may be transferred using a variety of approaches, including the use of the transmitter of wireless device 12 associated with the receiver, a separate transmitter (e.g., Bluetooth® or 802.11), or a cable.

In particular, in one non-limiting example as highlighted earlier, the described embodiments may be utilized for cellular telephone radiated antenna/receiver tests, such as: (1) a Total Isotropic Sensitivity (TIS) test; (2) a Total Radiated Power (TRP) test; and (3) an antenna pattern correlation (rho) test.

All three of these radiated tests require spherical measurement of antenna gain for both vertical and horizontal polarizations. Inherent in the TIS test is a measurement of the antenna receive gain pattern, although it is traditionally accomplished indirectly via receiver sensitivity. The TRP test depends on a measurement of the antenna's transmit gain. The antenna pattern correlation test, or antenna rho test, requires simultaneous measurement of complex voltage receive ("RX") gain, including amplitude and phase, of two or more antennas. The physical procedure of measuring spherical gain is essentially the same for all tests: measure the loss between transmitter and receiver as the phone is physically rotated around the sphere, most commonly in a series of Great Circle cuts (elevation cuts). What differs between each test is the nature and position of the transmitter and receiver.

In the case of the TIS test and antenna pattern correlation test, the transmitter, typically a cell-site simulator such a communication simulator module 142, is connected to a range directional antenna such as a horn antenna 144, and the receiver is connected to the antenna under test. In this case, the receiver is receiver module 70 and the antenna under test is antenna system 72 of wireless device 12. For the TRP test, wireless device 12 acts as the transmitter, and the receiver is an RF power meter 148 connected to the range antenna 144.

In these tests, receiver module 70 of wireless device 12 makes the necessary measurements for the RX-based tests (RX Gain, Antenna Rho). By using receiver module 70 of wireless device 12, the described embodiments provide a number of advantages, such as: time savings, since wireless device 12 does not have to be modified for testing; and, potentially, more accurate results since the prior art modification of wireless device 12 and the prior art use of external equipment and cables may alter the gain pattern of the antenna.

Additionally, radiated performance testing module 40 provides access to receiver data 82, such as RX_AGC (received power) and Pilot I/Q estimates from each rake finger via API 62 interfacing with processing subsystems 64. Further, radiated performance testing module 40 logs receiver data 82 to device test log 74 within data repository 58. This approach provides the advantage of being able to test wireless device 12 with no cables attached. At this point, wireless device 12 becomes both the test equipment and the data logger. This provides a cleaner test setup which evaluates wireless device 12 in a more representative state (uncabled) and may provide time savings as well.

Further, the above-described set-up allows all necessary test data to be logged in one single place—on wireless device 12. For example, with system 10, position controller 136 can be queried for position information at the time of each power measurement. This position information, or some data (such as a time) corresponding to this position information, may be communicated to wireless device 12 during testing (without cables) such that all necessary test data can be logged on wireless device 12. This enables wireless device 12 to synchronously log position information with receiver parameters such that a power versus position record can be collected on the fly. Alternatively, controller system 14 may record the position information and a time, or some other variable that can be synchronized with wireless device 12, corresponding to the position information. At the same time, wireless device 12 records the measured data parameter and the time (or other synchronization data). In this alternative, wireless device 12 may send the log to controller system 14, which can synchronize the position information with the measured data parameters via the time, or other synchronization data. For example, synchronization data 36 may comprise a pulse that is sent at the beginning of a procedure to provide a predetermined starting point in the log of wireless device 12. In another embodiment, position information, or at least synchronization data 36, may be transmitted to wireless device 12 via: a data socket opened over an active traffic channel, encoding in one or more unused fields in the forward link overhead channel messages, such as the SID, network identification ("NID"), or base station latitude and longitude in system parameter message; and, data could be communicated over auxiliary channels such as Bluetooth® or 802.11 frequency channels.

The TIS test accounts for interaction of antenna and phone electronics, inclusive of jamming effects from unwanted noise radiated by phone electronics that can couple to the antenna module. In particular, with regard to the TIS test, a MediaFLO receiver sensitivity measurement entails finding the traffic channel power at which the received signal quality begins to degrade; specifically, the point at which the packet error rate (PER) becomes 0.5%. Similarly, CDMA receiver sensitivity measurement entails finding the traffic channel power at which the received signal quality begins to degrade; specifically, the point at which the frame error rate (FER) becomes 0.5%. It should be noted, however, that some other PER or FER threshold may be specified, depending on the given scenario. Further, it should be noted that other threshold parameters may be utilized. For example, utilizing global system for mobile communications ("GSM") technology, the threshold parameter may be bit error rate ("BER"). For the CDMA case, the Cellular Telecommunications & Internet Association ("CTIA")-specified procedure for the TIS test dictates that a radiated sensitivity measurement is made at every 30° in the Theta (elevation) and Phi (azimuth) axes. Again, depending on the scenario, other predetermined positions may be utilized. Excluding points at Theta=0° and 180°, this prior art technique requires 60 individual sensitivity measurements for each polarization, which are subsequently integrated over the sphere, producing the TIS metric. This is an extremely time consuming test to perform, since identification of the sensitivity point at each position requires a gradual, iterative process, which in the past has been performed manually.

The described embodiments, however, provide for accelerating the speed at which the TIS test can be performed. The radiated sensitivity around the sphere varies only as a result of the variation of antenna RX gain. All other factors in the link are constant. As such, it follows that if the antenna's RX gain pattern is known, then a sensitivity measurement is required at only a single reference point, preferably the point of maximum antenna gain. Therefore, radiated sensitivity, Sens, at any other point $(\theta,\phi)$ on the sphere can be expressed as:

$$Sens(\theta,\phi)=Sens(\theta_o,\phi_o)+[G_{RX}(\theta,\phi)-G_{RX}(\theta_o,\phi_o)] \qquad (1)$$

where $Sens(\theta,\phi)$ is the radiated sensitivity at spherical coordinate $(\theta,\phi)$, expressed in dBm, $G_{RX}(\theta,\phi)$ is the RX antenna gain at spherical coordinate $(\theta,\phi)$, expressed in dB, and $(\theta_o,\phi_o)$ is the coordinate of the reference sensitivity measurement, i.e. preferably the sensitivity at the position of maximum gain.

In the prior art, this approach is impractical, since as mentioned previously, prior art devices are altered destructively to measure $G_{RX}(\theta,\phi)$. However, the described embodiments allow $G_{RX}(\theta,\phi)$ to be determined non-destructively, since received power measurements are performed by receiver module 70 of wireless device 12. Thus, in one particular embodiment, the following accelerated methodology for each polarization (vertical and horizontal) may be utilized:

(1) execute radiated performance testing module 40 to measure and log $G_{RX}(\theta,\phi)$ at a predetermined plurality of positions, such as 30° increments for $(\theta,\phi)$ which in this case defines a shape of a sphere, (excluding $\theta$=0° and 180°);

(2) identify the position, $(\theta_o,\phi_o)$, at which $G_{RX}$ is maximum;

(3) perform a single radiated sensitivity test at position $(\theta_o,\phi_o)$, i.e. ramping down transmitted power to the wireless device while monitoring PER (or FER for a CDMA-based device; or BER for a GSM-based device) until a predetermined threshold PER is reached, to determine Sens $(\theta_o,\phi_o)$;

(4) apply Equation 1 above to the entire set of predetermined positions, such as the previously-mentioned spherical positions, to determine $Sens(\theta,\phi)$ for each predetermined position; and (5) integrate the calculated $Sens(\theta,\phi)$ over the shape of the predetermined positions in order to determine the TIS metric for the wireless device.

In other words, TIS requires "radiated sensitivity patterns" $EIS_v(\theta,\phi)$ and $EIS_h(\theta,\phi)$, where $EIS_{v\;or\;h}$ (Effective Isotropic Sensitivity) is the radiated receiver sensitivity at a given measurement angle $(\theta,\phi)$ for a given PER (or BER or FER) threshold. In a test chamber, however, these values are difficult to measure directly since the call often drops when the device under test is rotated to an antenna pattern null (e.g., the receive signal level can go below phone noise level). To avoid this problem, the receive patterns are measured at a received power level high enough to avoid dropped calls, and then scaled by the measured peak sensitivity value to derive $EIS_v(\theta,\phi)$ and $EIS_h(\theta,\phi)$ patterns. For example, in one embodiment, the chamber path losses are calibrated so that a known power level is incident on the device under test that is about equal to or greater than 30 dB above the phone's noise floor (e.g., about −70 dBm at the phone test site is a good number for a typical phone). It should be noted, however, that other dBm values may be utilized depending on the given test scenario. The antenna gain patterns $(G_v(\theta,\phi), G_h(\theta,\phi))$ are derived from the above measured pattern data by normalizing to the RSSI value, i.e., the measured power, reported by the phone when "injecting" the reference power level (−70 dBm in this case) directly into the receiver (usually via the RF test port on the phone). This is the value the phone would report if the antenna gain at a given measurement angle was 0 dBi and the power incident at the phone was −70 dBm. Deviations from this value indicate the receive antenna gain.

The peak radiated receiver sensitivity, Peak $EIS(\theta_{pk},\phi_{pk})$, is then measured in the anechoic chamber at the angle of incidence $(\theta,\phi)$ and for the chamber horn polarization (vertical, v, or horizontal, h) resulting in the peak antenna gain. The EIS patterns are obtained by normalizing the antenna gain patterns by the peak EIS value:

$$EIS_{v\;or\;h}(\theta,\phi)=\text{Peak}EIS(\theta_{pk},\phi_{pk})-G_{v\;or\;h}(\theta,\phi).$$

Once the $EIS_v(\theta,\phi)$ and $EIS_h(\theta,\phi)$ patterns are known, the TIS metric is obtained by performing a spatial average of the patterns over a sphere of test angles:

$$TIS = \frac{4\pi}{\oiint \{EIS_v(\theta,\phi)+EIS_h(\theta,\phi)\}\cdot\sin\theta\cdot d\theta d\phi}$$

This technique allows for the calculations to be made entirely on wireless device 12, entirely at control system 14, or some combination thereof. For example, wireless device 12 can independently make determinations when in receipt of synchronization data 36, such as position information, or synchronization data 36 such as time information 114 in combination with the log from controller system 14 of synchronization data 36 versus position information. Wireless device 12 may determine $G_{RX}(\theta_o,\phi_o)$ and transmit position $(\theta_o,\phi_o)$ to controller system 14 for re-orientation of positioning system 28 and initiation of the sensitivity testing portion of the protocol. Wireless device 12 may then calculate the required Sens($\theta,\phi$), and perform the integration to determine the TIS metric, which it may store and/or send to controller system 14.

Alternatively, the data collection at wireless device 12 may be interrupted after Steps 1 and 2 to allow device test log 86 to be offloaded from wireless device 12 to, for example, controller system 14 for post-processing to determine $G_{RX}(\theta,\phi)$ and $G_{RX}(\theta_o,\phi_o)$. For example, log 86 includes a record of measured data versus synchronization data. At this point, controller system 14 may send control signal 16 to position wireless device at position $(\theta_o,\phi_o)$ for the radiated sensitivity test. Similarly, wireless device 12 may offload device test log 86 after recording a set of sensitivity measurements at the position of maximum gain, or after determining Sens($\theta_o,\phi_o$). Then, controller system 14 can apply Equation 1 at all positions and/or perform the integration across the sphere, thereby determining the TIS metric.

Furthermore, Step 1 can be performed with wireless device 12 in idle mode, since the RX_AGC is active. Advantageously, this technique eliminates the need to maintain a traffic call during the duration of the test. Although, it should be noted that wireless device 12 may be in a call for Step 3, since FER may be defined only for traffic data frames.

In one embodiment, the above-described sensitivity test is performed manually—the forward link transmit power on the cell site simulator is adjusted by hand to reach the target PER on wireless device 12. As noted above, the described embodiments provide for the automation of the sensitivity test. For example, controller system 14 establishes a call with wireless device 12 and gradually ramps the forward link power down while maintaining a record of power vs. time, i.e. in control test log 122. Simultaneously, radiated performance testing module 40 records PER vs. time, i.e. in device test log 86. Radiated test manager module 44 receives device test log 86 and executes synchronization logic 132 to synchronize the measurements associated with the recorded time in each log 122 and 86, thereby generating synchronized log 134 which includes a record of PER vs. power. Based on this record of PER vs. power, performance analyzer module 130 may determine the point of 0.5% PER.

In another alternative, if the forward transmit power is communicated to wireless device 12 over the forward link, then all necessary data can be logged at the wireless device 12. In this case, radiated performance testing module 40 executes analyzer module 88 to determine the point of 0.5% PER. Thus, consolidating the logging on wireless device 12 advantageously eliminates the need for offline synchronization of logs 122 and 86 respectively from controller system 14 and wireless device 12.

With regard TRP, the TRP test is a performance test of the transmit chain of wireless device 12. For this test, wireless device 12 may be configured via device test configuration 76 to transmit at full power. For example, in a CDMA device, this is most often accomplished by instructing the cell site simulator to send "all-up" power control bits while a traffic call is maintained. Power received from wireless device 12 is measured by power meter 148 attached to antenna range directional (horn) antenna 144.

The CTIA-specified procedure for the TRP test dictates that a power measurement is made at every 15° in the Theta (elevation) and Phi (azimuth) axes for each polarization. Excluding points at Theta=0° and 180°, this technique requires 264 individual data points for each polarization, which are subsequently integrated over the sphere, producing the TRP metric. Due to the overlap in the positions at which measurements are desired, the described embodiments allow the TRP test to be performed simultaneously with the TIS test, thereby providing substantial time savings.

Alternatively, another method to configure wireless device 12 for full-power operation is to manually set the digital transmit gain by placing it in Factory Test Mode (FTM). In this configuration, the TRP test can be performed simultaneously with the idle mode RX gain determination described above with regard to the TIS test, providing for potential time savings.

In other words, the TRP metric may be determined by the following equation:

$$TRP = \frac{1}{4\pi} \cdot \oiint [EIRP_v(\theta,\phi) + EIRP_h(\theta,\phi)] \cdot \sin\theta \cdot d\theta d\phi$$

where $EIRP_v(\theta,\phi)$ is the effective isotropic radiated power for the vertical polarization, and $EIRP_h(\theta,\phi)$ is the effective isotropic radiated power for the horizontal polarization, which can be determined from the transmit gain patterns, $G_{v\,or\,h}(\theta,\phi)$:

$$G_{v\,or\,h}(\theta,\phi) = EIRP_{v\,or\,h}(\theta,\phi)/\text{MaxPAOut}$$

where MaxPAOut is the maximum power out of the power amplifier, i.e. the maximum power out of transmitter module 68, at each test frequency.

It follows that the peak effective radiated power, PeakEIRP, is the maximum value of the EIRP pattern:

$$\text{Peak}EIRP = \text{Max}[\text{Max}(EIRP_v(\theta,\phi)), \text{Max}(EIRP_h(\theta,\phi))]$$

The PeakEIRP may be needed for regulatory certification of a wireless device, i.e., SAR, class level certification, radiated emissions.

Further, another transmit mode radiated performance characteristic is the antenna efficiency, $\eta$:

$$\eta = \frac{1}{4\pi} \cdot \oiint [G_v(\theta,\phi) + G_h(\theta,\phi)] \cdot \sin\theta \cdot d\theta d\phi$$

which is derived in a manner similar to deriving TRP from the antenna gain patterns.

Pattern envelope correlation, $\rho_e$, evaluates the potential for diversity gains of a dual antenna, dual receiver phone in a mobile environment. The rho test determines fading correlation based on measuring complex gains. The measured complex Rx patterns for the primary and secondary antennas (e.g., E$\theta$1, E$\phi$1, E$\theta$2, E$\phi$2, as discussed below) can be used to estimate the envelope correlation resulting from a model of the incident field on the antenna pair.

With the advent of receiver diversity as an available feature in current-generation of mobile station modem ("MSM") ASICs, a need has developed for radiated tests to predict how well a multi-antenna system will perform in the field. MIMO devices will benefit from such a test as well. A crucial design parameter for a dual-antenna device is the correlation between antennas. An antenna pair which produces highly correlated signals in the dual receive chains is of minimal use for receive diversity. The described embodiments utilize the envelope correlation, also known as the fading correlation, as a predictor of diversity gain in dual antenna systems.

The envelope correlation can be predicted from complex voltage gain patterns of a pair of antennas and an assumed incident RF field. As with other receive gain measurements, the complex antenna gain pattern has traditionally been measured using a cabled test. In the case of a commercial wireless device, this requires destructive modification of the device to install external connectors. Instead of destructive modification, however, the described embodiments utilize component of receiver module 70 of wireless device 12. For example, in the case of a cellular phone, the CDMA rake receiver functionality requires accurate phase estimates of the Pilot channel. By providing an active Pilot channel from a cell-site simulator, such as simulator 142, and having radiated performance test module 40 log the received power from each receive chain/antenna, as may be found in an RX_AGC data packet, and the in-phase/quadrature-phase (I/Q) Pilot estimates, as may be found in a RX_Pilot Finger data packet, from the rake receiver as the phone is rotated around a sphere, a complex gain pattern can be generated entirely on wireless device 12. This requires no destructive modification of the handset.

As with the receiver gain pattern discussed above, all logging may be consolidated on wireless device 12 if position/angle information is wirelessly transmitted to the device, such as over the forward link, during data collection.

If wireless device 12 does not accurately implement receiver diversity in Idle mode, multi-antenna complex pattern determination may be accomplished with wireless device 12 in a traffic call.

In particular, the described embodiments include apparatus and methods for estimating the envelope fading correlation $\rho_e$ in a mobile environment from the measured complex radiated patterns from a pair of antennas on wireless device 12 within test chamber 20.

The complex voltage V incident on an $m^{th}$ antenna element at $(\theta,\phi)$ due to the $k^{th}$ electromagnetic plane wave (ray), $F^k_m(\theta,\phi)$ with a complex antenna field pattern, $E_m(\theta,\phi)$, can be given by:

$$V_m^k = \int_0^{2\pi}\int_0^{\pi} E_m(\theta,\phi) \cdot F_m^k(\theta,\phi) \cdot \sin\theta \cdot d\theta \cdot d\phi$$
$$= \int_0^{2\pi}\int_0^{\pi} (E_{\theta,m}(\theta,\phi) \cdot F_{\theta,m}^k(\theta,\phi) + E_{\phi,m}(\theta,\phi) \cdot F_{\phi,m}^k(\theta,\phi)) \cdot \sin\theta \cdot d\theta \cdot d\phi$$

Then, the variance in the total complex antenna field pattern at this antenna element, $$E[|V_m^k|^2], \text{ is:}$$

$$E[|V_m^k|^2] = P_V \cdot \int_0^{2\pi}\int_0^{\pi} |E_{\theta,m}(\theta,\phi)|^2 \cdot P_\theta(\theta,\phi) \cdot \sin\theta \cdot d\theta \cdot d\phi +$$
$$P_H \cdot \int_0^{2\pi}\int_0^{\pi} |E_{\phi,m}(\theta,\phi)|^2 \cdot P_\phi(\theta,\phi) \cdot \sin\theta \cdot d\theta \cdot d\phi$$

where $P_\theta$ and $P_\phi$ represent the incident field angular power density functions in $\theta$ (vertical polarization) and $\phi$ (horizontal polarization) directions, $P_V$ and $P_H$ are constants representing the mean incident powers on wireless device 12 in $\theta$ (vertical) and $\phi$ (horizontal) polarizations, respectively, over a representative RF environment, such as may be found along a random drive route.

For antennas 1 and 2, the cross covariance, $$E[V_1^k \cdot V_2^{k*}],$$

between received signals from the two antennas is:

$$E[V_1^k \cdot V_2^{k*}] = E[V_{\theta,1}^k \cdot V_{\theta,2}^{k*}] + E[V_{\phi,1}^k \cdot V_{\phi,2}^{k*}] =$$
$$P_H \cdot \int_0^{2\pi}\int_0^{\pi} (XPR \cdot E_{\theta,1}(\theta,\phi) \cdot E_{\theta,2}^*(\theta,\phi) \cdot P_\theta(\theta,\phi) +$$
$$E_{\phi,1}(\theta,\phi) \cdot E_{\phi,2}^*(\theta,\phi) \cdot P_\phi(\theta,\phi)) \cdot \sin\theta \cdot d\theta \cdot d\phi$$

where $XPR = P_V/P_H$, and where * indicates the complex conjugate.

From the two signal variances and the cross covariance, the envelope correlation coefficient is given by:

$$\rho_e \cong |\rho|^2 = \frac{|E[V_1^k \cdot V_2^{k*}]|^2}{E[V_1^k \cdot V_1^{k*}] \cdot E[V_2^k \cdot V_2^{k*}]}$$

The measured complex antenna patterns, $E\theta1$, $E\phi1$, $E\theta2$, $E\phi2$, for wireless device 12 having antenna system 72 with dual antennas at discrete angles over a field of view covering $4\pi$ steradians can be used in the previous formulation to calculate $\rho_e$ as follows:

$$R_{12} = \sum_{j=1}^{N\phi}\sum_{i=1}^{N\theta} (XPR \cdot E\theta1_{i,j} \cdot E\theta2_{i,j}^* \cdot P\theta_i + E\phi1_{i,j} \cdot E\phi2_{i,j}^* \cdot P\phi i) \cdot \sin\theta_i \cdot \Delta\theta \cdot \Delta\phi$$

$$\sigma1 = \sum_{j=1}^{N\phi}\sum_{i=1}^{N\theta} (XPR \cdot E\theta1_{i,j} \cdot E\theta1_{i,j}^* \cdot P\theta_i + E\phi1_{i,j} \cdot E\phi1_{i,j}^* \cdot P\phi i) \cdot \sin\theta_i \cdot \Delta\theta \cdot \Delta\phi$$

$$\sigma2 = \sum_{j=1}^{N\phi}\sum_{i=1}^{N\theta} (XPR \cdot E\theta2_{i,j} \cdot E\theta2_{i,j}^* \cdot P\theta_i + E\phi2_{i,j} \cdot E\phi2_{i,j}^* \cdot P\phi i) \cdot \sin\theta_i \cdot \Delta\theta \cdot \Delta\phi$$

where: R is related to the cross covariance between antennas 1 and 2; i, j are indices relating to the angular position of the measured sample; $N\theta$ represents the number of $\theta$ angles; and, $N\phi$ represents the number of $\phi$ angles.

Then, the envelope correlation, $\rho_e$, is:

$$\rho_e = \frac{|R_{12}|^2}{\sigma1 \cdot \sigma2}$$

In these calculations, values for XPR (polarization ratio of incident field), and the form of $P_\theta$ and $P_\phi$ functions are dependent on the RF environment (e.g., urban, suburban, rural, highway, etc.).

As an example, expressions for $P_\theta$ and $P_\phi$ for a channel model with uniform spread in azimuth and Gaussian spread in elevation is given below:

$$P\theta i = P_v i = A_V \cdot \exp\left[-\frac{(\theta i - m_V)^2}{2\sigma_V^2}\right]$$

$$P\phi i = P_h i = A_h \cdot \exp\left[-\frac{(\theta i - m_h)^2}{2\sigma_h^2}\right]$$

where: Av and Ah are normalization constants such that $P_\theta$ and $P_\phi=1$ when integrated over the sphere; $m_v$, $m_h$ are mean angle of arrival of the respective $\theta,\phi$ polarized external fields, in one embodiment having typical values of $m_v=5$ degrees and $m_h=10$ degrees; and $\sigma_\theta$, $\sigma_\phi$ are the angular spreads of the respective $\theta,\phi$ polarized external fields, in one embodiment having typical values of $\sigma_\theta=15$ degrees and a $\sigma_\phi=30$ degrees.

It should be noted, however, that other expressions are possible.

Several phone mockups with dual antennas were fabricated. Complex patterns were measured and the fading correlation was calculated from the patterns for each test case. The resultant p values ranged from 0.05 to 0.98. Additionally, the same mockup phones were used to measure the correlation between signals received by each antenna in typical indoor environments. The tests were performed in areas covered by the local PCS service provider.

In particular, referring to FIG. 7, the measured "pattern" correlation results from measurements in test chamber 20 were seen to compare favorably to those obtained from raw field measurements. For example, graph 700 includes a horizontal axis 702 corresponding to measured pattern p values and a vertical axis 704 corresponding to field p values for: a phone 706 having a single dipole antenna connected to a splitter and measured in non-line-of-sight ("NLOS") conditions (indoors); a phone 708 having two pair of dipole antennas with 0.05λ separation measured on a rooftop in near line-of-sight ("LOS") conditions; a phone 710 having two pair of dipole antennas with 0.05λ separation measured in NLOS conditions; a clamshell phone 712 having one external antenna and one internal antenna measured in NLOS conditions; a clamshell phone 714 having one external antenna and one internal antenna measured in NLOS conditions; a phone 716 with a dual stubby external antenna measured in NLOS conditions; and, a phone 718 with a stubby external antenna and an internal antenna measured in NLOS conditions. Thus, graph 700 indicates that the ρ's calculated from the patterns and field data nearly lay on top of each other for a large range of ρ values.

Due to the correlation between the measured pattern ρ's and the field ρ's, these results confirm that laboratory tests can be performed, according to the described embodiments, to evaluate the diversity performance of dual antenna diversity enabled wireless devices without having to resort to extensive field testing.

Further, referring to FIG. 8, a table 800 includes an example of calculated ρ's 802 for different channel models 804 using measured radiated patterns from a demonstration phone. In this case, channel models 804 include an indoor environment with an outside base transceiver station, an urban microcell, an urban macrocell, and a highway macrocell. Further, each channel model 804 includes a different set of variables 806. In this case, for example, variables 806 include polarized wave, m, angular spread, σ, and polarization ratio, XPR. It should be noted that the statistics used for the channel models were from measurements done by Kalliola, et. al., "Angular Power Distribution and Mean Effective Gain of Mobile Antennas In Different Propagation Environments," *IEEE Transactions on Vehicular Technology*, Vol. 51, No. 5, September 2002, hereby incorporated by reference. Based on these calculated results, the described apparatus and methods provide a robust approach for using complex radiated patterns to estimate the fading correlation between dual antennas in mobile environments to characterize the diversity performance of diversity-enabled wireless devices.

Thus, in the described embodiments, one or more predetermined radiated performance characteristics may be determined for a wireless device during a single test, where the wireless device is uncabled, and where the wireless device records its own measured values along with synchronization data in a resident memory. For example, the radiated performance characteristics may include the TIS value, the TRP value, and the envelope correlation, $\rho_e$. The calculated value of the radiated performance characteristic, based on measurements described herein, may then be compared to some predetermined threshold, such as may be set by a network carrier, a manufacture or standards group, in order to determine a radiated performance acceptability, approval, and/or certification of the wireless device.

While the foregoing disclosure shows illustrative embodiments, it should be noted that various changes and modifications could be made herein without departing from the scope of the described embodiments as defined by the appended claims. Furthermore, although elements of the described embodiments may be described or claimed in the singular, the plural is contemplated unless limitation to the singular is explicitly stated.

What is claimed is:

1. A method for determining a radiated performance characteristic of a wireless device, comprising:
   determining a measured signal characteristic of a forward link only signal received by the wireless device at each one of a plurality of associated time instances, wherein the plurality of associated time instances is relative to a starting time instance;
   receiving a synchronization signal;
   setting the starting time instance in a log based on the synchronization signal, wherein the synchronization signal is a pulse signal; and
   recording the measured signal characteristics in the log on the wireless device at each associated time instance in the plurality of associated time instances.

2. The method of claim 1, wherein the measured signal characteristic is a power gain.

3. The method of claim 1, further comprising determining an antenna gain pattern based on the measured signal characteristics.

4. The method of claim 3, wherein the antenna gain pattern is an antenna power gain pattern.

5. The method of claim 3, wherein the antenna gain pattern is an antenna complex voltage gain pattern.

6. The method of claim 3, further comprising determining a location of peak gain in the antenna gain pattern.

7. The method of claim 6, further comprising determining a peak receiver sensitivity using the location of peak gain in the antenna gain pattern.

8. The method of claim 7, further comprising determining a lowest power level at the location of peak gain in the antenna gain pattern at which a predetermined signal quality indicator can be received.

9. An apparatus for determining a radiated performance characteristic of a wireless device, comprising:

means for determining a measured signal characteristic of a forward link only signal received by the wireless device at each one of a plurality of associated time instances, wherein the plurality of associated time instances is relative to a starting time instance;

means for receiving a synchronization signal;

means for setting the starting time instance in a log based on the synchronization signal, wherein the synchronization signal is a pulse signal; and means for recording the measured signal characteristics in the log on the wireless device at each associated time instance in the plurality of associated time instances.

10. The apparatus of claim 9, wherein the measured signal characteristic is a power gain.

11. The apparatus of claim 9, further comprising means for determining an antenna gain pattern based on the measured signal characteristics.

12. The apparatus of claim 11, wherein the antenna gain pattern is an antenna gain pattern selected from the group consisting an antenna power gain pattern and an antenna complex voltage gain pattern.

13. The apparatus of claim 11, further comprising means for determining a peak receiver sensitivity using a location of peak gain in the antenna gain pattern.

14. At least one processor configured to perform the actions of:

determining a measured signal characteristic of a forward link only signal received by a wireless device at each one of a plurality of associated time instances, wherein the plurality of associated time instances is relative to a starting time instance;

receiving a synchronization signal;

setting the starting time instance in a log based on the synchronization signal, wherein the synchronization signal is a pulse signal; and recording the measured signal characteristics in the log on the wireless device at each associated time instance in the plurality of associated time instances.

15. The at least one processor of claim 14, wherein the measured signal characteristic is a power gain.

16. The at least one processor of claim 14, wherein the at least one processor is further configured to perform the actions of determining an antenna gain pattern based on the measured signal characteristics.

17. The at least one processor of claim 16, wherein the antenna gain pattern is an antenna gain pattern selected from the group consisting an antenna power gain pattern and an antenna complex voltage gain pattern.

18. The at least one processor of claim 16, wherein the at least one processor is further configured to perform the actions of determining a peak receiver sensitivity using a location of peak gain in the antenna gain pattern.

19. A product comprising a machine-readable medium and programming embodied in the medium that, when executed by a processor in the gateway device, implements the method of claim 1.

* * * * *